United States Patent
Hsu et al.

(10) Patent No.: US 10,672,860 B2
(45) Date of Patent: *Jun. 2, 2020

(54) MULTI-TERMINAL INDUCTOR FOR INTEGRATED CIRCUIT

(71) Applicant: Taiwan Semiconductor Manufacturing Co., Ltd., Hsin-Chu (TW)

(72) Inventors: Ching-Chung Hsu, Taichung (TW); Chung-Long Chang, Hsinchu (TW); Tsung-Yu Yang, Zhubei (TW); Hung-Chi Li, Taipei (TW); Cheng-Chieh Hsieh, Tainan (TW); Che-Yung Lin, Hsinchu (TW); Grace Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/587,305

(22) Filed: Sep. 30, 2019

(65) Prior Publication Data

US 2020/0066831 A1  Feb. 27, 2020

Related U.S. Application Data

(63) Continuation of application No. 16/106,525, filed on Aug. 21, 2018, now Pat. No. 10,475,877.

(51) Int. Cl.
*H01L 49/02* (2006.01)
*H01F 27/28* (2006.01)
(Continued)

(52) U.S. Cl.
CPC ............ *H01L 28/10* (2013.01); *H01F 27/24* (2013.01); *H01F 27/2804* (2013.01);
(Continued)

(58) Field of Classification Search
CPC ....... H01L 28/10; H01L 23/528; H01L 24/13; H01L 24/11; H01L 21/76895
(Continued)

(56) References Cited

U.S. PATENT DOCUMENTS 6,037,649 A    3/2000  Liou
7,924,131 B2   4/2011  Walls
(Continued)

OTHER PUBLICATIONS

Silvaco. Questex11.in: Comparing One Turn and Straight Line Inductors. Date of publication is unknown. Retrieved online on Nov. 16, 2017 from https://www.silvaco.com/examples/quest/section1/example12/index.html.
(Continued)

*Primary Examiner* — John P. Dulka
(74) *Attorney, Agent, or Firm* — Eschweiler & Potashnik, LLC

(57) ABSTRACT

A multi-terminal inductor and method for forming the multi-terminal inductor are provided. In some embodiments, an interconnect structure is arranged over a semiconductor substrate. A passivation layer is arranged over the interconnect structure. A first magnetic layer is arranged over the passivation layer, and a conductive wire laterally extends from a first input/output (I/O) bond structure at a first location to a second I/O bond structure at a second location. A third I/O bond structure branches off of the conductive wire at a third location between the first location and the second location. A connection between the third I/O bond structure and the first I/O bond structure has a first inductance. Alternatively, a connection between the first I/O bond structure and the second I/O bond structure has a second inductance different than the first inductance.

20 Claims, 14 Drawing Sheets

(51) Int. Cl.
  *H01L 23/00* (2006.01)
  *H01F 27/29* (2006.01)
  *H01F 27/24* (2006.01)
  *H01L 21/768* (2006.01)
  *H05K 1/18* (2006.01)
  *H01L 23/528* (2006.01)
  *H01L 23/522* (2006.01)
  *H01L 21/321* (2006.01)
  *H01L 21/027* (2006.01)

(52) U.S. Cl.
  CPC ....... *H01F 27/29* (2013.01); *H01L 21/76843* (2013.01); *H01L 21/76895* (2013.01); *H01L 23/528* (2013.01); *H01L 23/5227* (2013.01); *H01L 24/11* (2013.01); *H01L 24/13* (2013.01); *H01L 24/81* (2013.01); *H05K 1/181* (2013.01); *H01L 21/0273* (2013.01); *H01L 21/3212* (2013.01); *H01L 21/7684* (2013.01); *H01L 2224/13025* (2013.01); *H01L 2224/16227* (2013.01); *H01L 2924/19042* (2013.01); *H01L 2924/19104* (2013.01); *H05K 2201/1003* (2013.01)

(58) Field of Classification Search
  CPC ................. H01L 23/5227; H01L 24/81; H01L 21/76843; H05K 1/181; H01F 27/2804; H01F 27/24; H01F 27/29
  See application file for complete search history.

(56) References Cited

U.S. PATENT DOCUMENTS

| | | | | |
|---|---|---|---|---|
| 8,169,050 B2 * | 5/2012 | Daley | ................. | H01L 23/5223 257/531 |
| 2003/0013264 A1 | 1/2003 | Yeo et al. | | |
| 2007/0268105 A1 * | 11/2007 | Walls | ................... | H01F 17/0013 336/200 |
| 2008/0061420 A1 | 3/2008 | Degani et al. | | |
| 2008/0204183 A1 * | 8/2008 | Loza | ................... | H01F 17/0013 336/200 |
| 2011/0027945 A1 * | 2/2011 | Saitou | ................... | H01L 21/486 438/125 |
| 2011/0108941 A1 | 5/2011 | Guzek et al. | | |
| 2011/0308072 A1 * | 12/2011 | Ahn | ..................... | H01F 17/0013 29/602.1 |
| 2012/0268229 A1 * | 10/2012 | Yen | ...................... | H01L 23/5227 336/200 |
| 2014/0011324 A1 * | 1/2014 | Liu | .......................... | H01L 24/74 438/107 |
| 2015/0302975 A1 * | 10/2015 | Qi | .......................... | H01F 41/041 336/200 |
| 2017/0213638 A1 * | 7/2017 | Otsubo | ................... | H01F 27/29 |
| 2017/0365402 A1 * | 12/2017 | Fukushima | .......... | H01F 17/0013 |
| 2018/0090260 A1 * | 3/2018 | Ishida | ................. | H01F 27/2804 |
| 2018/0218830 A1 * | 8/2018 | Nakanishi | ........... | H01F 17/0013 |
| 2019/0035534 A1 * | 1/2019 | Suzuki | ................ | H01F 27/2804 |
| 2019/0074131 A1 * | 3/2019 | Yamanaka | ............... | H01F 27/24 |
| 2019/0156989 A1 * | 5/2019 | Hu | .......................... | H01F 27/02 |
| 2019/0164905 A1 * | 5/2019 | Hsieh | .................... | H01L 23/552 |

OTHER PUBLICATIONS

U.S. Appl. No. 15/793,127, filed Oct. 25, 2017.
Non-Final Office Action dated Apr. 18, 2019 for U.S. Appl. No. 15/793,127.
Notice of Allowance dated Jul. 31, 2019 in connection with U.S. Appl. No. 15/793,127.
Notice of Allowance dated Jul. 10, 2019 in connection with U.S. Appl. No. 16/106,525.

* cited by examiner

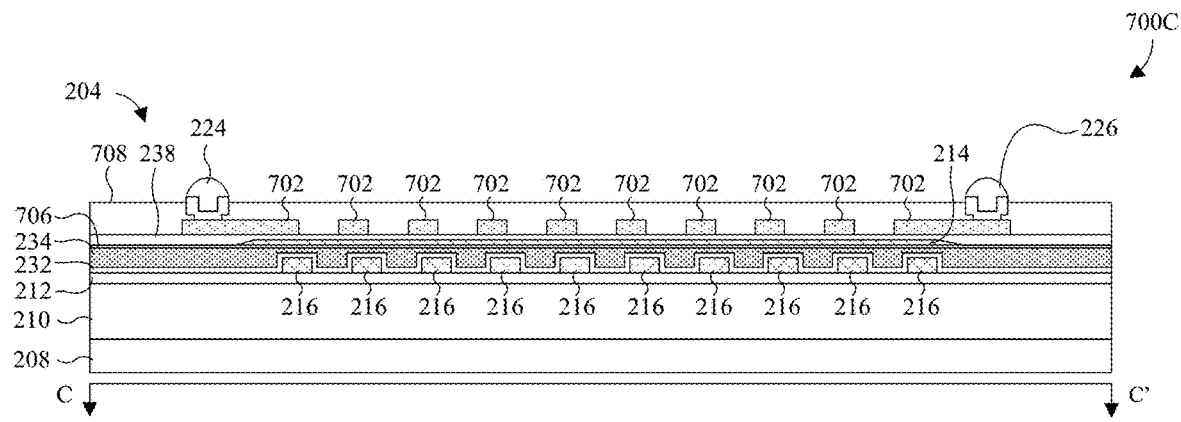
Fig. 7C
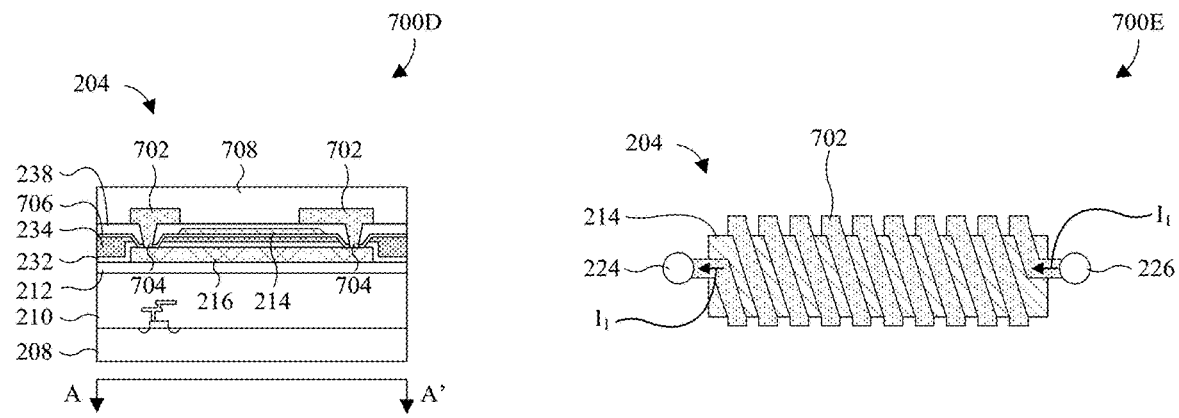
Fig. 7D
Fig. 7E

MULTI-TERMINAL INDUCTOR FOR INTEGRATED CIRCUIT

REFERENCE TO RELATED APPLICATIONS

This Application is a Continuation of U.S. application Ser. No. 16/106,525 filed Aug. 21, 2018. The contents of the above-referenced Applications are hereby incorporated by reference in their entirety.

BACKGROUND

An integrated circuit is an assembly of electronic components on a single piece of semiconductor material. A widely used electronic component in an integrated circuit is an inductor. An inductor is a passive element that stores electrical energy in a magnetic field when electric current flows through the inductor. Because any conductor of electrical current has inductive properties, inductors vary greatly in their design. Inductors are versatile devices that may be used in, among other things, RL filters, LC circuits, RLC circuits, power supplies, transformers, and many other circuit components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7E illustrate various views of more embodiments of the multi-terminal inductor of the present disclosure.

DETAILED DESCRIPTION

Figure 1A:
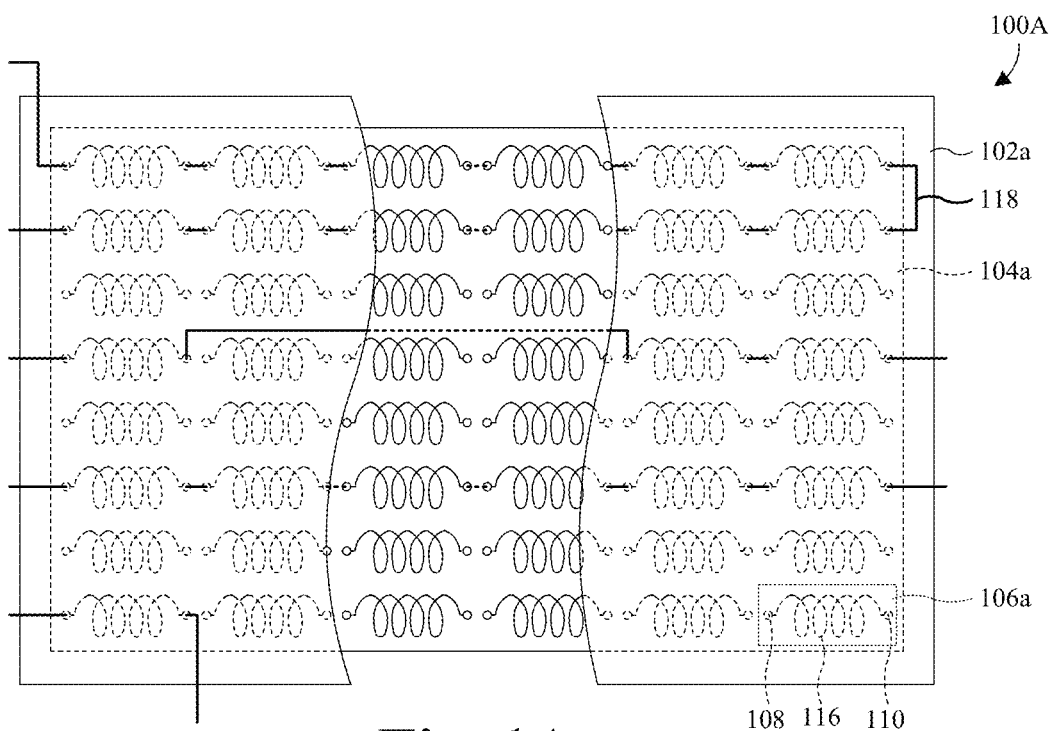
FIGS. 1A-1B illustrate various top views of some embodiments of a multi-terminal inductor having a plurality of inductor units connected by a printed circuit board in various different combinations.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some inductors are integrated monolithically on a semiconductor substrate. In some embodiments, integrated inductors are formed within back-end-of-the-line (BEOL) metal interconnect layers over a substrate. Because any conductor of electrical current has inductive properties, integrated inductors are implemented in a variety of layouts, for example, spiral inductors, planar spiral inductors, straight line inductors, or coupled inductors. Moreover, depending on the application, an integrated inductor may comprise, for example, a dielectric material (e.g., an air core), a ferromagnetic, or a ferrimagnetic core. For example, an integrated spiral inductor may comprise a magnetic core arranged within a first metal layer. A metal wire may wind around the magnetic core in a helical pattern, such that the metal wire has multiple turns that continuously extend around the magnetic core.

One challenge with the above inductors is providing customers with an inductor that precisely fits their needs. Customers often design integrated circuits (ICs) requiring an inductor. These ICs are designed to run at a specific inductance. Typically, the manufacturer of the IC implements the inductor into the customer's IC. However, because each specific IC application requires a specific inductance to run optimally, manufactures typically implement a pre-designed inductor having a specific inductance. This pre-designed inductor may have an inductance that is a fixed value, which may be greater/less than required for the customer's IC. This difference in inductance may increase the overall resistance of the customer's IC and cause the customer's IC to run at a less than optimal state. Furthermore, because the inductance of an inductor is directly proportional to an area of the inductor, implementing an inductor into a customer's IC that is greater than required takes up valuable space on the IC. A partial solution to this challenge is to design IC specific inductors. However, this greatly increases the cost of manufacturing the IC. Therefore, an inductor that increases the amount of inductance values a customer may choose from without requiring application specific inductor designs would improve the functionality and cost of manufacturing ICs.

The present disclosure relates to a multi-terminal inductor (and related method) that is structured so as to provide inductance at fixed increments, thereby providing customers with increased inductance options when an inductor is required for an IC. In some embodiments, the multi-terminal inductor is disposed over a passivation layer that is disposed over an interconnect structure. The multi-terminal inductor may comprise a plurality of inductor units arranged in an array. Each inductor unit comprises a conductive wire resulting in each inductor unit having a measurable inductance. Furthermore, each inductor unit comprises at least two input/output (I/O) bond structures. Therefore, the individual I/O bond structures of each inductor unit may be coupled together by the end customer (or the manufacturer) in a variety of combinations to achieve various inductances. Accordingly, because the multi-terminal inductor provides customers with increased inductance options, the multi-terminal inductor improves the functionality of ICs and reduces the cost to manufacture ICs.

Figure 1B:
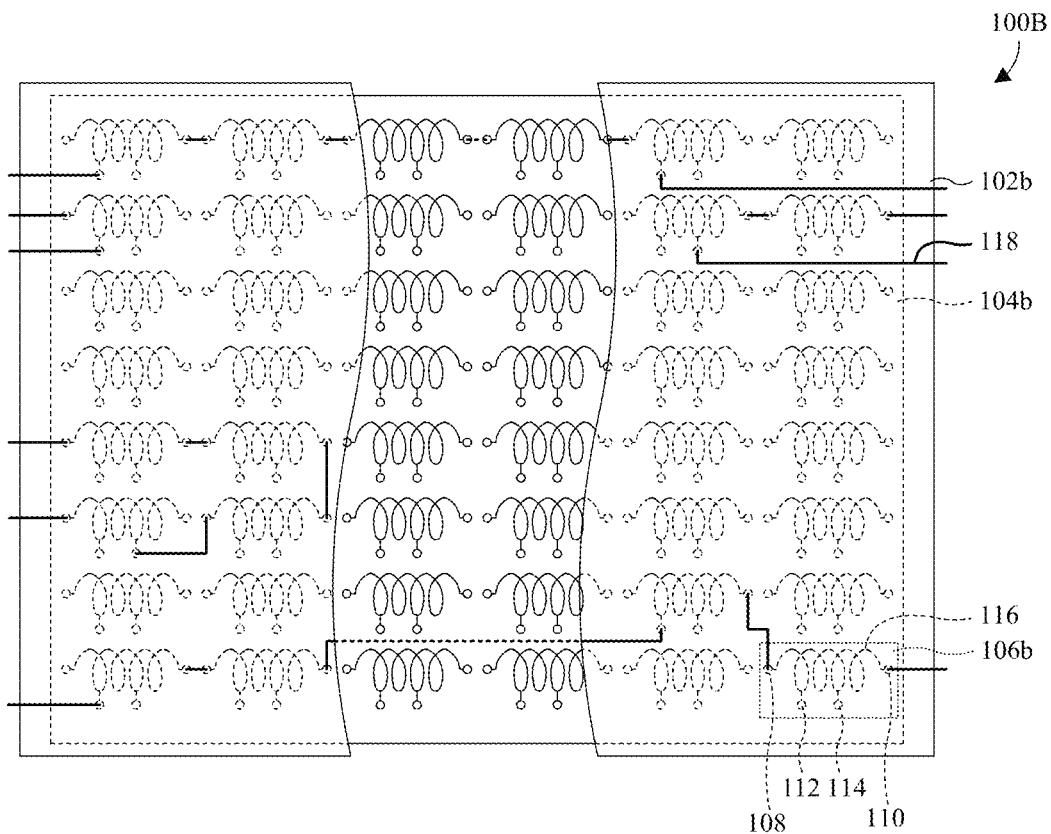

With reference to FIGS. 1A-1B, various top views 100A-100B of some embodiments of a multi-terminal inductor having a plurality of inductor units connected by a printed circuit board (PCB) in various different combinations is provided.

As illustrated by views 100A-100B of FIGS. 1A-1B, a connection structure 102a/102b, which often takes the form of a printed circuit board (PCB), is arranged over the multi-terminal inductor 104a/104b. The multi-terminal inductor 104a/104b is part of an integrated circuit (IC) formed on a semiconductor substrate. The multi-terminal inductor 104a/104b comprises a plurality of inductor units 106a/106b arranged in an array. For example, FIG. 1A and FIG. 1B each depict a multi-terminal inductor 104a/104b having an array of 48 inductor units 106a/106b, which are arranged in six columns and eight rows. For clarity, only one inductor unit 106a/106b is labeled in each figure.

Each inductor unit 106a/106b comprises at least a first input/output (I/O) bond structure 108 and a second I/O bond structure 110. Each inductor unit 106a/106b comprises a conductive wire 116 which has inductive properties and which couples a first I/O bond structure 108 to a second I/O bond structure 110. Thus, each inductor unit 106a/106b has a measurable inductance value, for example, 1 nanohenry (nH) to 100 nH. In some embodiments, each inductor unit 106a/106b within the multi-terminal inductor 104a/104b has substantially identical inductance values. In other embodiments, the inductor units 106a/106b may have differing inductance values, or a combination of substantially identical and differing inductance values. In some embodiments, each inductor unit 106a/106b can also include additional I/O bond structures 112/114.

The PCB 102a/102b comprises a plurality of conductive traces 118 that connect to the multi-terminal inductor 104a/104b via I/O bond structures 108/110/112/114 of the inductor units 106a/106b. The I/O bond structures may also be referred to as "terminals" in some embodiments. In some embodiments, the I/O bond structures 108/110/112/114 are solder bumps that are bonded to a pad (not shown) on the PCB 102a/102b via a heat induced (e.g., reflow oven or infrared heater) solder flow process. The PCB 102a/102b is separate from the multi-terminal inductor 104a/104b, such that the conductive traces 118 of the PCB 102a/102b provide a connection external to the IC. In some embodiments, the conductive traces 118 connect the multi-terminal inductor 104a/104b to external devices, such as external resistors, external capacitors, and/or external ICs. Thus, after the multi-terminal inductor 104a/104b is manufactured, the multi-terminal inductor 104a/104b can be shipped to a customer, and the customer can then provide a PCB 102a/102b that has conductive traces 118 configured to connect the inductor units 106a/106b together to achieve a particular inductance desired by the customer.

For example, as illustrated in FIG. 1A, the conductive traces 118 of the PCB 102a connect the top two rows of inductor units 106a of the multi-terminal inductor 104a in series, such that the top two rows of the multi-terminal inductor 104a has a first inductance of twelve inductance values. Furthermore, the same PCB 102a may connect another row of inductor units 106a of the same multi-terminal inductor 104a to output a second inductance. For example, as illustrated in the bottom row of the multi-terminal inductor 104a, the conductive traces 118 of the PCB 102a connect to a first I/O bond structure 108 of a first inductor unit 106a and a second I/O bond structure 110 of the first inductor unit 106a, such that the bottom row of the multi-terminal inductor 104a has a second inductance of one inductance value. Thus, the customer can integrate two (or more) different inductor units 106a/106b along with other components on the IC and/or external circuitry to achieve a desired functionality.

Further, as illustrated in view 100B of FIG. 1B, each inductor unit 106b may comprise a plurality of I/O bond structures 108/110/112/114. In this embodiment, each inductor unit 106b may output a plurality of inductance values. For example, an inductor unit 106b having four I/O bond structures 108/110/112/114 is configured to output at least a first inductance value, a second inductance value, a third inductance value, and a fourth inductance value. If the inductor unit 106b is connected by the conductive traces 118 of the PCB 102b such that current flows from the first I/O bond structure 108 to the second I/O bond structure 110, the inductor will have a first inductance value. If the inductor unit 106b is connected by the conductive traces 118 of the PCB 102b such that current flows from the third I/O bond structure 112 to the second I/O bond structure 110, the inductor will have a second inductance value that is less than the first inductance value. If the inductor unit 106b is connected by the conductive traces 118 of the PCB 102b such that current flows from the fourth I/O bond structure 114 to the second I/O bond structure 110, the inductor will have a third inductance value less than the second inductance value. Further, if the inductor unit 106b is connected by the conductive traces 118 of the PCB 102b such that current flows from the third I/O bond structure 112 to the fourth I/O bond structure 114, the inductor will have a fourth inductance value that can be the same as or different from each of the first, second, and third inductance values.

Moreover, as illustrated in FIG. 1B, part of a row of inductor units 106b may have a first inductance and a second inductance. For example, in the second row of the multi-terminal inductor 104b, the second row outputs a first inductance due to the conductive traces 118 of the PCB 102b connecting a first inductor unit 106b to allow current to flow from the first I/O bond structure 108 of the first inductor unit 106b to a second I/O bond structure 112 of the first inductor unit 106b. In the same row, a second inductance is output due to the conductive traces 118 of the PCB 102b connecting a second inductor unit 106b and a third inductor unit 106b in series, such that current flows from a fourth I/O bond structure 114 of the second inductor unit 106b through the second I/O bond structure 110 of the second inductor unit 106b into the first I/O bond structure 108 of the third inductor unit 106b and out the second I/O bond structure 110 of the third inductor unit 106b.

In addition, as illustrated in the bottom two rows of the multi-terminal inductor 104b of FIG. 1B, inductor units in separate rows may be connected together. For example, inductor units in the bottommost row of the multi-terminal inductor 104b are connected in series with an inductor unit 106b in the second to last row of the multi-terminal inductor 104b. Accordingly, because the inductor units 106a/106b of the multi-terminal inductor 104a/104b may be connected by the conductive traces 118 of the PCB 102a/102b in various combinations, the multi-terminal inductor 104a/104b provides customers (or manufacturers) with an inductor having increased inductance options without requiring an application specific inductor design.

Although FIGS. 1A-1B only illustrate a multi-terminal inductor 104a/104b having an array of 48 inductors units, which are arranged in six columns and eight rows, it will be appreciated that the multi-terminal inductors 104a/104b may comprise any number of inductor units 106a/106b arranged in any number of rows and columns.

Figure 2A:
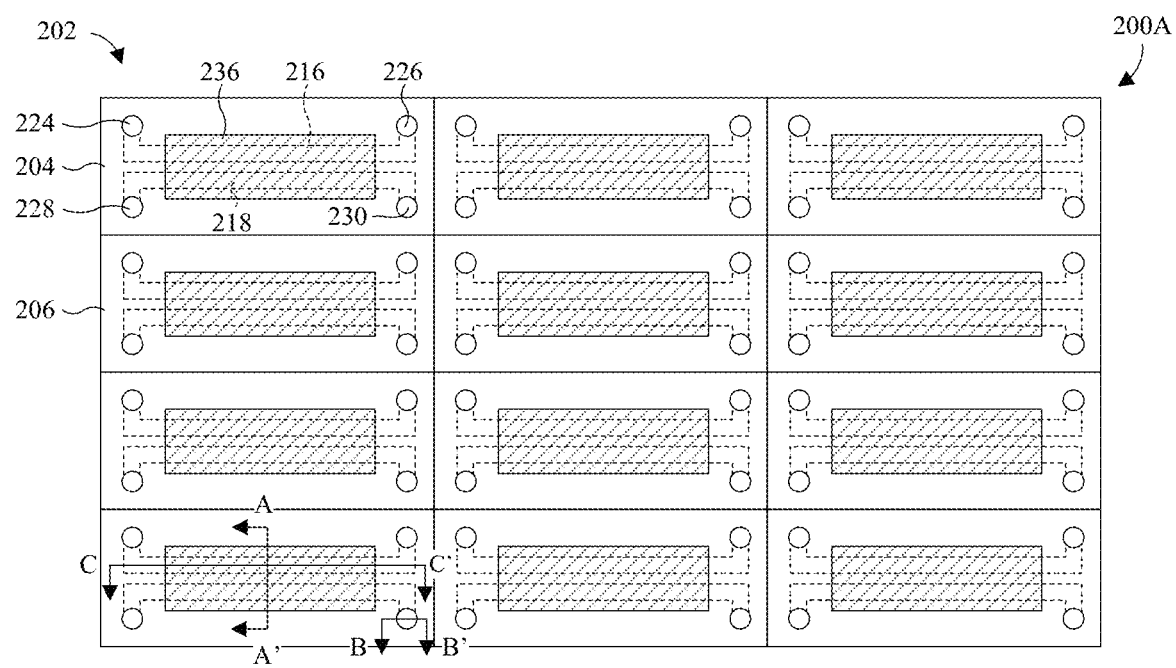
FIGS. 2A-2C illustrate various views of some embodiments of a multi-terminal inductor of the present disclosure.
Figure 2B:
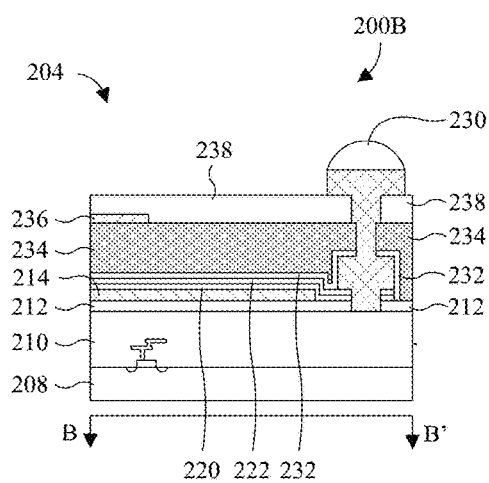
Figure 2C:
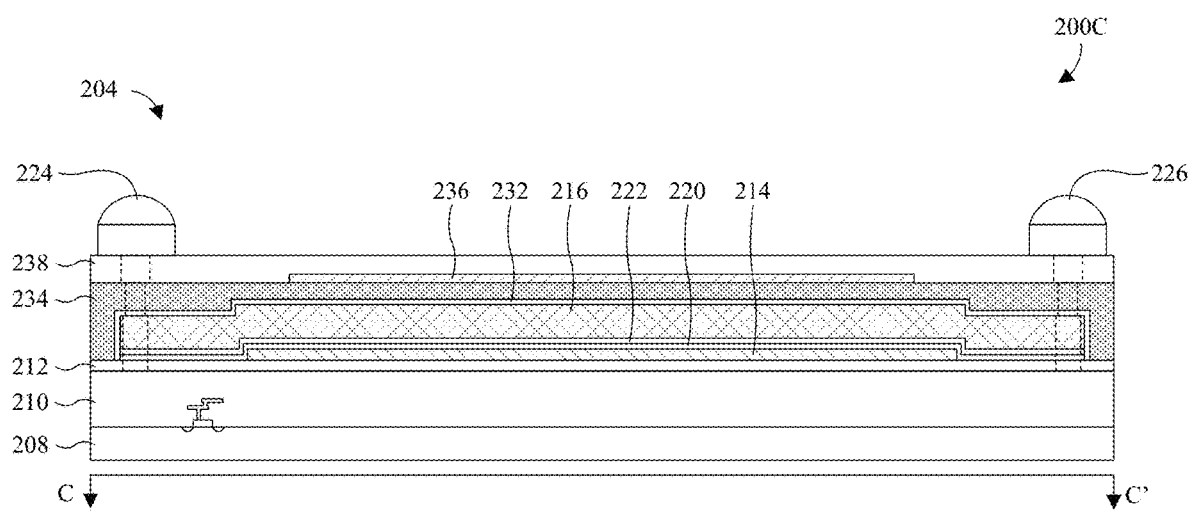

With reference to FIGS. 2A-2C, various views 200A-200C of some embodiments of the multi-terminal inductor of the present disclosure are provided. FIG. 2A illustrates a simplified top view 200A of some embodiments of the multi-terminal inductor of the present disclosure. FIG. 2A is "simplified" because FIG. 2A illustrates only conductive wires 216/218 and a second magnetic layer 236 of each inductor unit 204/206. FIG. 2B illustrates a cross-sectional view 200B of some embodiments of the inductor unit of the multi-terminal inductor of FIG. 2A, taken along line B-B' of FIG. 2A. FIG. 2C illustrates a cross-sectional view 200C of some embodiments of the inductor unit of the multi-terminal inductor of FIG. 2A, taken along line C-C' of FIG. 2A.

As illustrated by the views 200A-200C of FIGS. 2A-2C, a multi-terminal inductor 202 comprises a plurality of inductor units 204/206 arranged in an array. For example, the multi-terminal inductor 202 comprises a first inductor unit 204 and a second inductor unit 206. In some embodiments, the first inductor unit 204 and the second inductor unit 206 are arranged in the same lateral direction. In other embodiments, the first inductor unit 204 and the second inductor unit 206 are arranged perpendicular to one another. In some embodiments, the layout of the first inductor unit 204 is substantially identical to the layout of the second inductor unit 206. In other embodiments, the layout of the first inductor unit 204 is different than the layout of the second inductor unit 206. As illustrated in FIGS. 1A-1B, a PCB may connect the plurality of inductor units 204/206 in various combinations to vary the inductance of the multi-terminal inductor 202. For clarity, only one inductor unit 204 is labeled in detail. Because the multi-terminal inductor 202 comprises a plurality of inductor units 204/206 that may be connected by a PCB in various combinations, the multi-terminal inductor 202 provides an inductor having increased inductance options without requiring an application specific inductor design, which may result in increased manufacturing costs or inefficient operating conditions.

The multi-terminal inductor 202 comprises a semiconductor substrate 208. The semiconductor substrate 208 may comprise any type of semiconductor body (e.g., monocrystalline silicon/CMOS bulk, silicon-germanium (SiGe), silicon on insulator (SOI), etc.). The semiconductor substrate 208 may also comprise one or more semiconductor devices (e.g., transistor, resistor, diode, etc.) or portions of semiconductor devices. In some embodiments, the semiconductor device is disposed over/within the semiconductor substrate 208 in a front-end-of-line (FEOL) process. For example, the semiconductor device may be a transistor comprising a gate stack (e.g., a metal gate disposed over a high-k dielectric) disposed over the semiconductor substrate 208 and between a source and drain, while the source and drain are disposed within the semiconductor substrate 208.

An interconnect structure 210 is disposed over the semiconductor substrate 208. In some embodiments, the interconnect structure 210 is formed in a back-end-of-line (BEOL) process. The interconnect structure 210 may comprise a plurality of conductive features, for example, conductive contacts, conductive lines, conductive vias, and/or contact pads formed within an interlayer dielectric (ILD) material. The conductive features may comprise a metal, such as copper, aluminum, gold, silver, or other suitable metal. The ILD material may comprise silicon dioxide ($SiO_2$) or another suitable oxide, such as a low-k dielectric material. In some embodiments, the interconnect structure 210 may comprise a plurality of metal layers (e.g., metal layer 1, metal layer 2, etc.) disposed over one another. Each metal layer may comprise a conductive line, and a conductive via may connect a conductive line from a first metal layer to a conductive line of a second metal layer. Some conductive vias connect a conductive line to a contact pad disposed near a top surface of the interconnect structure 210.

A passivation layer 212 is disposed over the interconnect structure 210. In some embodiments, the passivation layer is formed in a BEOL process. The passivation layer 212 may conformally line an uppermost surface of the interconnect structure 210. In some embodiments, the passivation layer 212 has a substantially planar top surface. The passivation layer 212 may comprise $SiO_2$, silicon nitride ($Si_3N_4$), polyimide compounds, or other suitable materials.

In some embodiments, a first magnetic layer 214 is disposed over the passivation layer 212. The first magnetic layer 214 is formed over the passivation layer 212 using a suitable process, for example, chemical vapor deposition (CVD), physical vapor deposition (PVD), atomic layer deposition (ALD), sputtering, electrochemical plating, electroless plating, or some other deposition or growth process. The first magnetic layer 214 comprises a magnetic material, such as cadmium zinc telluride (CZT), an iron-nickel (NiFe) compound, or other suitable magnetic materials. In some embodiments, the first magnetic layer 214 may comprise a plurality of stacked layers. In other embodiments, the first magnetic layer 214 may comprise a bulk magnetic material that extends from a bottom surface of the first magnetic layer 214 to a top surface of the first magnetic layer 214.

In some embodiments, the first magnetic layer 214 may comprise a rectangular layout. In some embodiments, the first magnetic layer 214 may comprise a plurality of discrete portions, such that each inductor unit 204/206 comprises a discrete portion of the first magnetic layer 214. In other embodiments, the first magnetic layer 214 may comprise continuous portions, such that a portion of the first magnetic layer 214 continuously extends under a plurality of inductor units 204/206. Further, the first magnetic layer 214 may have a thickness in a range from about 0.1 micrometers (μm) to about 15 μm. More specifically, the first magnetic layer 214 may have a thickness in a range from 0.1 μm to 0.5 μm, 0.5 μm to 2.5 μm, 2.5 μm to 4.5 μm, 4.5 μm to 7.5 μm, 7.5 μm to 10 μm, 10 μm to 12.5 μm, or 12.5 μm to 15 μm. Moreover, the first magnetic layer 214 may have a width in a range from about 10 μm to about 500 μm. More specifically, the first magnetic layer 214 may have a width in a range from 10 μm to 50 μm, 50 μm to 100 μm, 100 μm to 150 μm, 150 μm to 200 μm, 200 μm to 250 μm, 250 μm to 300 μm, 300 μm to 350 μm, 350 μm to 400 μm, 400 μm to 450 μm, or 450 μm to 500 μm.

A conductive wire 216/218 is disposed over the first magnetic layer 214. In some embodiments, each inductor unit 204/206 comprises a first conductive wire 216 and a second conductive wire 218 disposed over the first magnetic layer 214. The conductive wire 216/218 may, for example, be deposited or grown by CVD, PVD, ALD, sputtering, electrochemical plating, electroless plating, or some other deposition or growth process. The conductive wire 216/218 comprises a conductive material, such as copper (Cu), aluminum (Al), gold (Au), silver (Ag), Al—Cu compounds, or any other suitable conductive material. In some embodiments, the conductive wire 216/218 may be a post-passivation copper interconnect. In some embodiments, the conductive wire 216/218 has a thickness in a range from about 0.5 μm to about 50 μm and/or a width in a range from about 0.5 μm to about 50 μm. More specifically, the conductive wire 216/218 may have a thickness/width in a range from 0.5 μm to 5 μm, 5 μm to 10 μm, 15 μm to 20 μm, 20 μm to 25 μm, 25 μm to 30 μm, 30 μm to 40 μm, or 40 μm to 50 μm.

In some embodiments, a barrier layer 222 is disposed over a first isolation layer 220, such that the barrier layer 222 and the first isolation layer 220 physically separate and electrically isolate the conductive wire 216/218 from the first magnetic layer 214. In some embodiments, the barrier layer 222 comprises tantalum (Ta), tantalum nitride (TaN), titanium (Ti), titanium nitride (TiN), and/or tungsten (W) among others. A seed layer, from which the conductive wire 216/218 is grown, is disposed directly over the barrier layer 222. The seed layer comprises Cu, Cu alloys, Al, Al alloys, Au, Ag, Al—Cu compounds, or other suitable materials, and may coalesce into the conductive wire 216/218 when the conductive wire 216/218 is grown from the seed layer, and as such is not called out explicitly in FIG. 2B. The first isolation layer 220 comprises a dielectric material, such as $SiO_2$, $Si_3N_4$, a low-k dielectric, or some other suitable dielectric material. The first isolation layer 220 and the barrier layer 222 may, for example, be deposited or grown by CVD, PVD, ALD, sputtering, electrochemical plating, electroless plating, or some other deposition or growth process.

The first conductive wire 216 extends from a first input/output (I/O) bond structure 224 of the inductor unit 204/206 to a second I/O bond structure 226 of the inductor unit 204/206. In some embodiments, the first conductive wire 216 extends continuously from the first I/O bond structure 224 to the second I/O bond structure 226 in a substantially straight line. Further, the first conductive wire 216 may conformally line the first magnetic layer 214 and extend beyond outermost sidewalls of the first magnetic layer 214, such that the first conductive wire 216 has a first upper surface over the first magnetic layer 214 that is above a second upper surface of the first conductive wire 216 beyond outermost sidewalls of the first magnetic layer 214. In other embodiments, the first conductive wire 216 wire continuously extends from the first I/O bond structure 224 to the second I/O bond structure 226 in a helical pattern around the first magnetic layer 214. In some embodiments, the second conductive wire 218 extends from a third I/O bond structure 228 of the inductor unit 204/206 to a fourth I/O bond structure 230 of the inductor unit, and has a substantially identical layout to the first conductive wire 216. Accordingly, because each inductor unit 204/206 has its own respective I/O bond structures 224/226/228/230, a PCB may connect the inductor units 204/206 in various combinations to have the multi-terminal inductor 202 output various inductances without the need to have an application specific inductor design, which may result in increased manufacturing costs or inefficient operating conditions.

A second isolation layer 232 is disposed over the conductive wire 216/218. In some embodiments, the second isolation layer 232 may conformally line the surfaces of the passivation layer 212, the first magnetic layer 214, and the conductive wires 216/218, such that the second isolation layer 232 directly contacts the passivation layer 212, the first magnetic layer 214, and the conductive wires 216/218. The second isolation layer 232 comprises a dielectric material, such as $SiO_2$, $Si_3N_4$, a low-k dielectric, or some other suitable dielectric material. The second isolation layer 232 may, for example, be deposited or grown by CVD, PVD, ALD, sputtering, or some other deposition or growth process.

A first dielectric layer 234 is disposed over the second isolation layer 232. The first dielectric layer 234 may, for example, be a polyimide compound, a polybenzoxazole compound, and/or any other suitable dielectric material. The first dielectric layer 234 may, for example, be deposited or grown by CVD, PVD, ALD, sputtering, a spin-on process, or some other deposition or growth process. In some embodiments, the first dielectric layer 234 may have a substantially planar upper surface. In yet further embodiments, over the first magnetic layer 214, the first dielectric layer 234 may have a thickness in a range from about 0.5 μm to about 70 μm. More specifically, the thickness may be in a range from 0.5 μm to 5 μm, 5 μm to 10 μm, 10 μm to 15 μm, 15 μm to 20 μm, 20 μm to 25 μm, 25 μm to 30 μm, 30 μm to 40 μm, 40 μm to 50 μm, 50 μm to 60, or 60 μm to 70. Further, over the first magnetic layer 214, the dielectric may have a width in a range from about 10 μm to about 450 μm. More specifically, the width may be in a range from 10 μm to 50 μm, 50 μm to 100 μm, 100 μm to 150 μm, 150 μm to 200 μm, 200 μm to 250 μm, 250 μm to 300 μm, 300 μm to 350 μm, 350 μm to 400, or 400 μm to 450 μm.

In some embodiments, a second magnetic layer 236 is disposed over the first dielectric layer 234. The second magnetic layer 236 is formed over the first dielectric layer 234 using a suitable process, for example, CVD, PVD, ALD, sputtering, electrochemical plating, electroless plating, or some other deposition or growth process. The second magnetic layer 236 comprises a magnetic material, such as cadmium zinc telluride (CZT), an iron-nickel (NiFe) compound, or other suitable magnetic materials. In some embodiments, the second magnetic layer may 236 comprises a plurality of stacked layers. In other embodiments, the second magnetic layer 236 may comprises a bulk magnetic material that extends from a bottom surface of the second magnetic layer 236 to a top surface of the second magnetic layer 236.

A second dielectric layer 238 is disposed over the second magnetic layer 236. The second dielectric layer 238 lines an upper surface of the second magnetic layer 236 and an upper surface of the first dielectric layer 234. In some embodiments, the second dielectric layer 238 may, for example, be a polyimide compound, a polybenzoxazole compound, and/or any other suitable dielectric material. The second dielectric layer 238 may, for example, be deposited or grown by CVD, PVD, ALD, sputtering, a spin-on process, or some other deposition or growth process. In further embodiments, the first dielectric layer may have a substantially planar upper surface.

The I/O bond structures 224/226/228/230 each branch off of their respective conductive wires 216/218. In some embodiments, each I/O bond structure 224/226/228/230 branches off of their respective conductive wire 216/218 through the second isolation layer 232, the first dielectric layer 234, and the second dielectric layer 238 to protrude from an uppermost surface of the second dielectric layer 238. In some embodiments, each I/O bond structure 224/226/228/230 branches off of their respective conductive wire 216/218 towards the semiconductor substrate 208 to connect to a conductive feature of the interconnect structure 210. Further, each I/O bond structure 224/226/228/230 may branch off of their respective conductive wire 216/218 at a non-zero angle to provide adequate spacing between the I/O bond structures 224/226/228/230, such that the I/O bond structures 224/226/228/230 are offset from their respective conductive wires 216/218 by a distance. In some embodiments, the I/O bond structures 224/226/228/230 comprise Cu, Cu alloys, Al, Al alloys, Au, Ag, Al—Cu compounds, or other suitable materials. The I/O bond structures 224/226/228/230 may, for example, be formed by CVD, PVD, ALD, sputtering, electrochemical plating, electroless plating, or some other deposition or growth process. Accordingly, a customer (or a manufacturer) may use an external connection (e.g., a PCB) to connect the I/O bond structures 224/226/228/230 in various combinations to have the multi-terminal inductor 202 output various inductances. Because the multi-terminal inductor unit 202 comprises a plurality of inductor units 204/206, the multi-terminal inductor unit 202 provides customers (or manufacturers) with more inductance options without requiring an application specific inductor design, which may result in increased manufacturing costs or inefficient operating conditions.

Figure 3A:
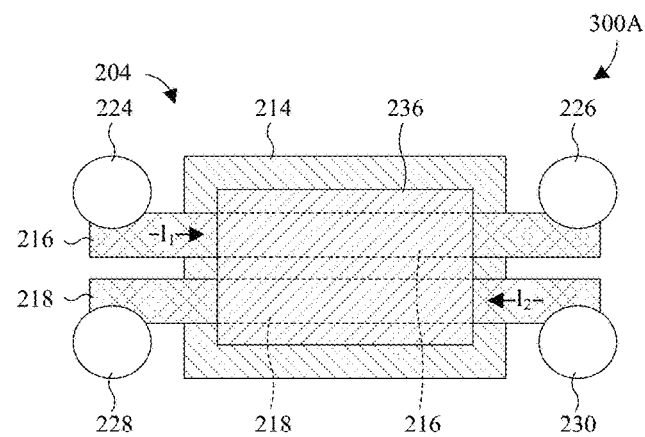
FIGS. 3A-3C illustrate various views of some more embodiments of the multi-terminal inductor of FIGS. 2A-2C.
Figure 3B:
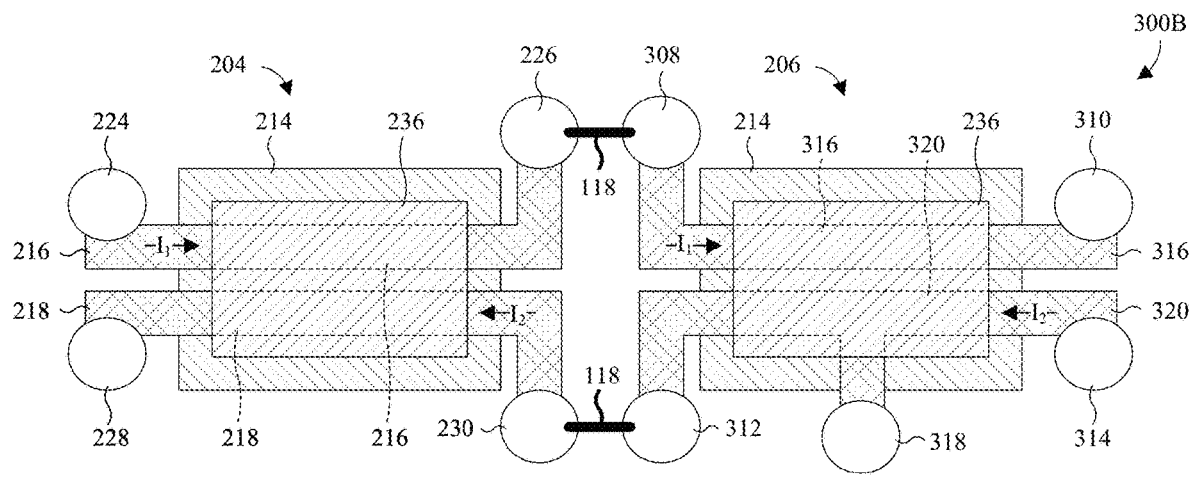
Figure 3C:
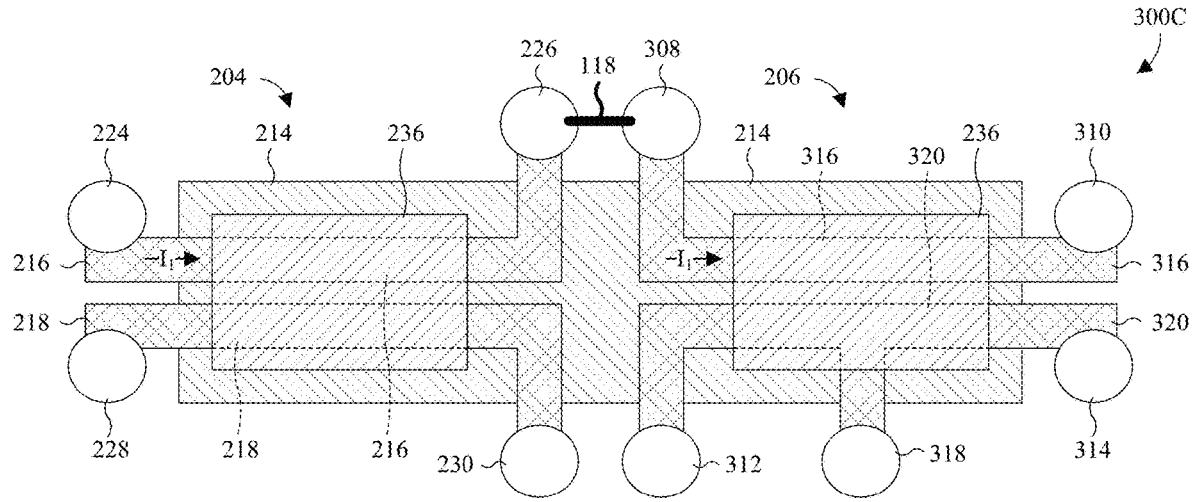

With reference to FIGS. 3A-3C, various views 300A-300C of some more embodiments of the multi-terminal inductor 202 of FIGS. 2A-2C are provided. FIG. 3A illustrates a simplified top view 300A of some embodiments of an inductor unit 204 of the multi-terminal inductor 202 of FIGS. 2A-2C. FIG. 3B illustrates a simplified top view 300B of some embodiments of the multi-terminal inductor 202 of FIGS. 2A-2C connected in a dual-current configuration. FIG. 3C illustrates a simplified top view 300C of some embodiments of a multi-terminal inductor 202 of FIGS. 2A-2C connected in a single-current configuration. FIGS. 3A-3C are "simplified" because FIGS. 3A-3C illustrate only the conductive wires, first magnetic layer, and second magnetic layer of each inductor unit.

As illustrated by the views 300A-300C of FIGS. 3A-3C, as current $I_1/I_2$ passes through a conductive wire 216/218, each conductive wire 216/218 induces a magnetic field. Depending on the direction of current $I_1/I_2$ flow, a magnetic field will be induced based on the "right-hand rule." For example, in some embodiments, a circuit is configured to provide a first current $I_1$ through the first conductive wire 216 so the first current $I_1$ flows from the left side of the page to the right side of the page, and provides a second current $I_2$ through the second conductive wire 218 so a second current $I_2$ flows from the right side of the page to the left side of the page. Thus, a first magnetic field is induced around the first conductive wire 216, and a second magnetic field is induced around the second conductive wire 218. Thus, the inductor units 204/206 have a measurable inductance.

As illustrated by the view 300B of FIG. 3B, a first inductor unit 204 is connected in series with a second inductor unit 206 and are connected in a dual-current configuration. The first inductor unit 204 and second inductor unit 206 are connected in a dual-current configuration because conductive traces 118 of a PCB (not shown) allow current to flow in opposite directions in each inductor unit 204/206. For example, a first current $I_1$ flows from the first I/O bond structure 224 of the first inductor unit 204 through the first conductive wire 216 of the first inductor unit 204 to the second I/O bond structure 226 of the first inductor unit 204. A conductive trace 118 couples the second I/O bond structure 226 of the first inductor unit 204 to a first I/O bond structure 308 of the second inductor unit 206 to allow the first current $I_1$ to flow into a first conductive wire 316 of the second inductor unit 206 and out of the second I/O bond structure 310 of the second inductor unit 206.

A second current $I_2$ flows from the fourth I/O bond structure 314 of the second inductor unit 206 through a second conductive wire 320 of the second inductor unit 206 to the third I/O bond structure 312 of the second inductor unit 206. A conductive trace 118 couples the third I/O bond structure 312 of the second inductor 204 to a fourth I/O bond structure 230 of the first inductor unit 204 to allow the second current $I_2$ to flow into the second conductive wire 218 of the first inductor unit 204 and out of the third I/O bond structure 228 of the first inductor unit 204. In some embodiments, the second inductor unit 206 may comprise a fifth I/O bond structure 318 that may be connected via a conductive trace 118 rather than connecting the conductive trace 118 to the third I/O bond structure 312. The fifth I/O bond structure 318 is disposed between the third I/O bond structure 312 and the fourth I/O bond structure 314. Thus, if current flows from the fourth I/O bond structure 314 to the fifth I/O bond structure 318, the second inductor unit 206 will have a measurable inductance that is less than a measurable inductance if current flows from the fourth I/O bond structure 314 to the third I/O bond structure 312. Accordingly, because the multi-terminal inductor 202 has a plurality of inductor units 204/206, the multi-terminal inductor unit 202 provides customers (or manufacturers) with more inductance options without requiring an application specific inductor design, which may result in increased manufacturing costs or inefficient operating conditions.

Moreover, as illustrated by the view 300C of FIG. 3C, the first inductor unit 204 and second inductor unit 206 are connected in a single-current configuration. The first inductor unit 204 and second inductor unit 206 are connected in a single-current configuration because conductive traces 118 of a PCB (not shown) allow current to only flow through one direction of each inductor unit 204/206. Moreover, in FIG. 3C, the first magnetic layer 214 continuously extends beneath both the first inductor unit 204 and the second inductor unit 206. Accordingly, because the multi-terminal inductor 202 can also be connected in a single-current configuration or a dual-current configuration, the multi-terminal inductor unit 202 provides additional inductance options to customers (or manufacturers), without requiring an application specific inductor design, which may result in increased manufacturing costs or inefficient operating conditions.

Figure 4A:
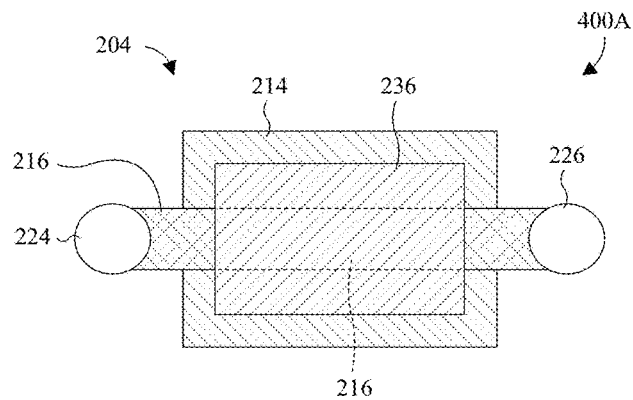
FIGS. 4A-4C illustrate various views of some more embodiments of the multi-terminal inductor of FIGS. 2A-2C.
Figure 4B:
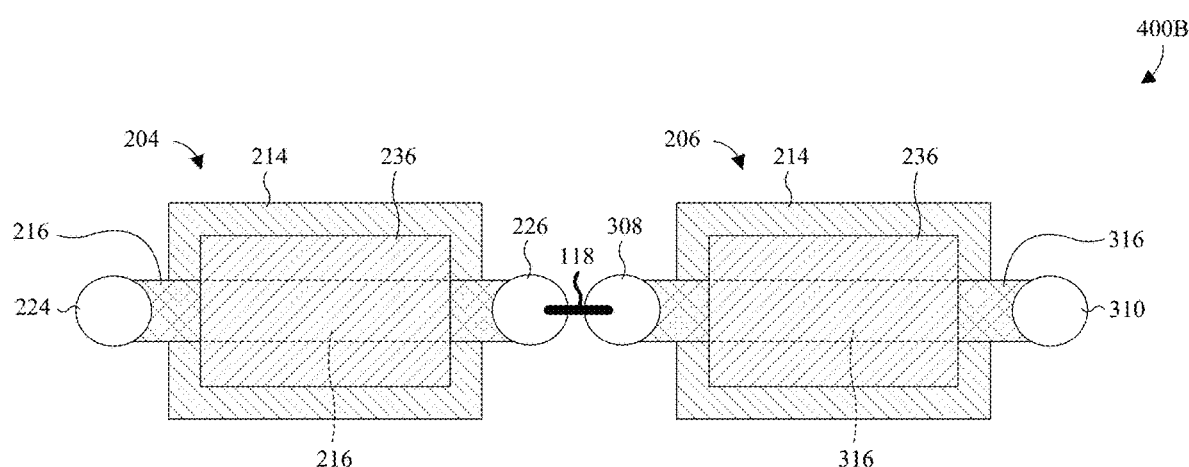
Figure 4C:
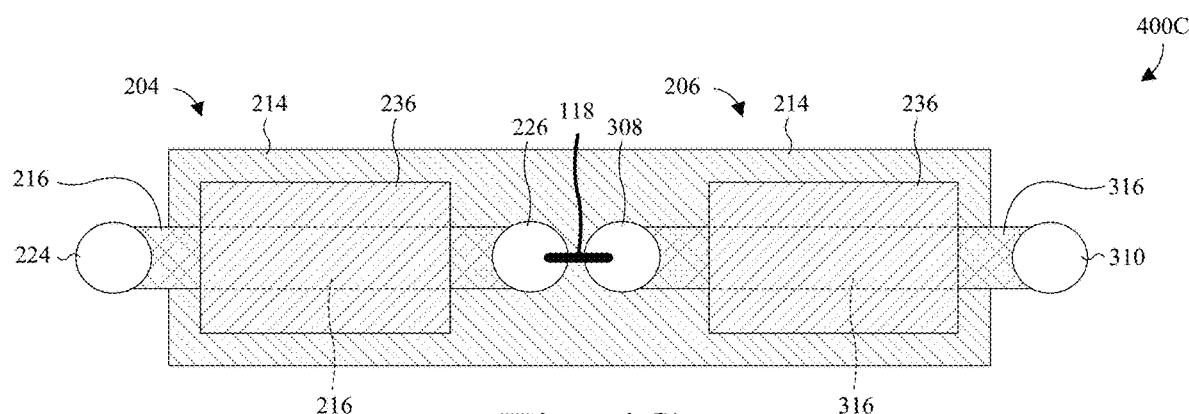

With reference to FIGS. 4A-4C, various views 400A-400C of some more embodiments of the multi-terminal inductor 202 of FIGS. 2A-2C are provided. FIG. 4A illustrates a simplified top view 400A of some embodiments of the first inductor unit 204 of the multi-terminal inductor 202 of FIGS. 2A-2C. FIG. 4B illustrates a simplified top view 400B of some embodiments of the multi-terminal inductor 202 of FIGS. 2A-2C with each inductor unit 204/206 disposed over discrete portions of the first magnetic layer 214. FIG. 4C illustrates a simplified top view 400C of some embodiments of a multi-terminal inductor 202 of FIGS. 2A-2C where the first magnetic layer 214 continuously extends between a first inductor unit 204 and a second inductor unit 206. FIGS. 4A-4C are "simplified" because FIGS. 4A-4C illustrate only the conductive wires 216/218, first magnetic layer 214, and second magnetic layer 236 of each inductor unit 204/206.

As illustrated by the views 400A-400C of FIGS. 4A-4C, the inductor unit 204/206 comprises only a single conductive wire 216/316 continuously extending from a first I/O bond structure 224/308 to a second I/O bond structure 226/310. In some embodiments, each inductor unit 204/206 may be disposed over a discrete portion of the first magnetic layer 214, as illustrated in FIG. 4B. In other embodiments, the first magnetic layer 214 continuously extends under both the first inductor unit 204 and the second inductor unit 206, as illustrated in view 400C of FIG. 4C.

With reference to FIGS. 5A-5C through 6A-6C, various views of various more embodiments of the multi-terminal inductor 202 of FIGS. 2A-2C without a first magnetic layer 214 or a second magnetic layer 236 are provided. Figures with the suffix "A" (e.g., FIG. 5A) are cross-sectional views, taken along line A-A' of FIG. 2A, of some embodiments of the first inductor unit 204 without the first magnetic layer 214 or the second magnetic layer 236. Figures with the suffix "B" (e.g., FIG. 5B) are top views of the first inductor unit 204 of the multi-terminal inductor 202 without the first magnetic layer 214 or the second magnetic layer 236. Figures with the suffix "C" (e.g., FIG. 5C) are top views of some embodiments of the multi-terminal inductor 202 of FIGS. 2A-2C without a first magnetic layer 214 or a second magnetic layer 236.

Figure 5A:
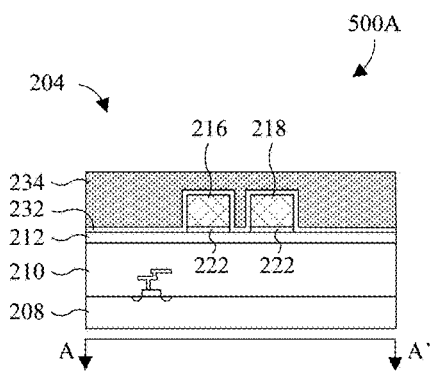
FIGS. 5A-5C and 6A-6C illustrate various views of various more embodiments of the multi-terminal inductor of FIGS. 2A-2C without a first magnetic layer or a second magnetic layer.
Figure 5B:
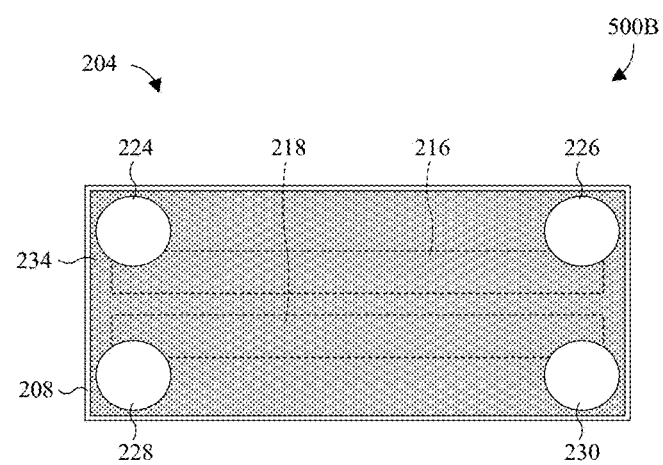
Figure 5C:
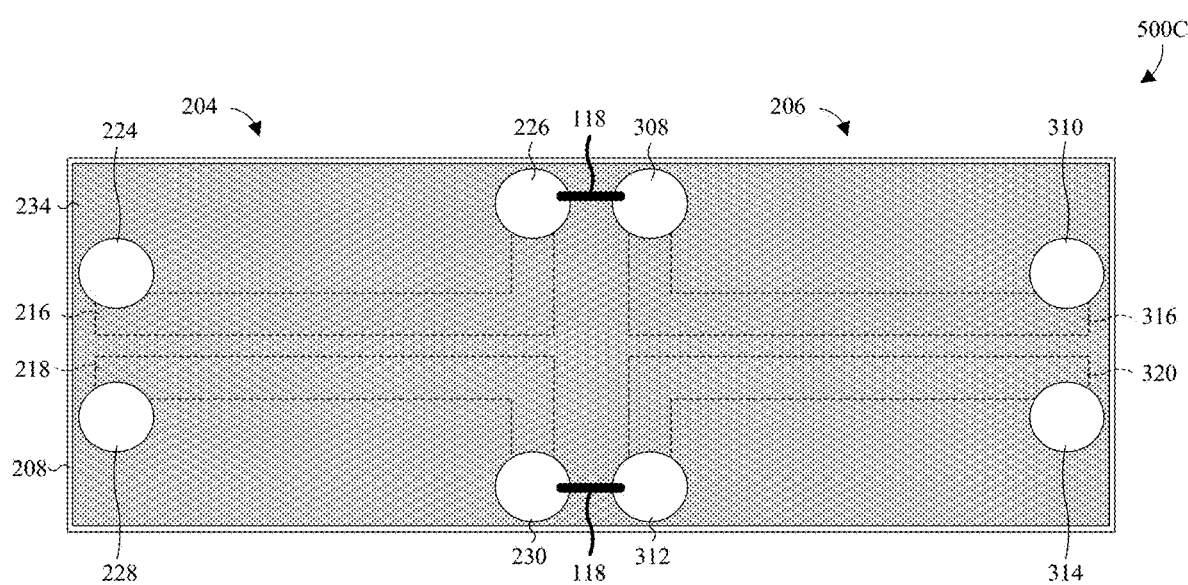
Figure 6A:
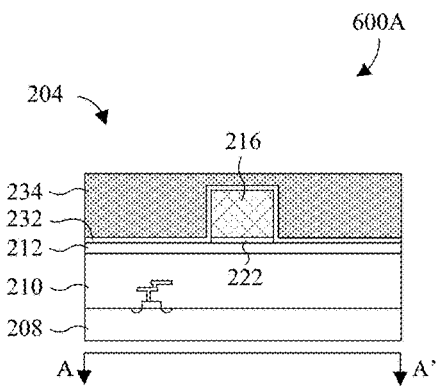
Figure 6B:
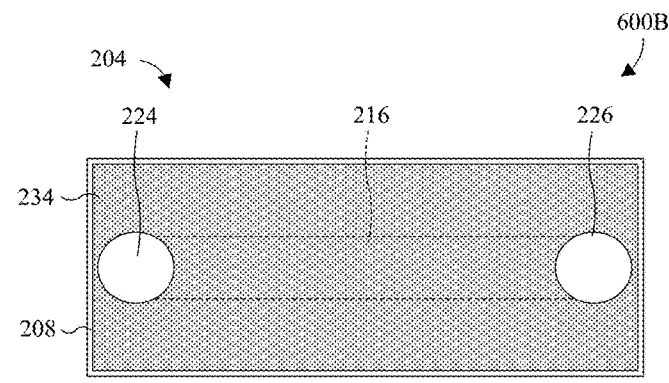
Figure 6C:
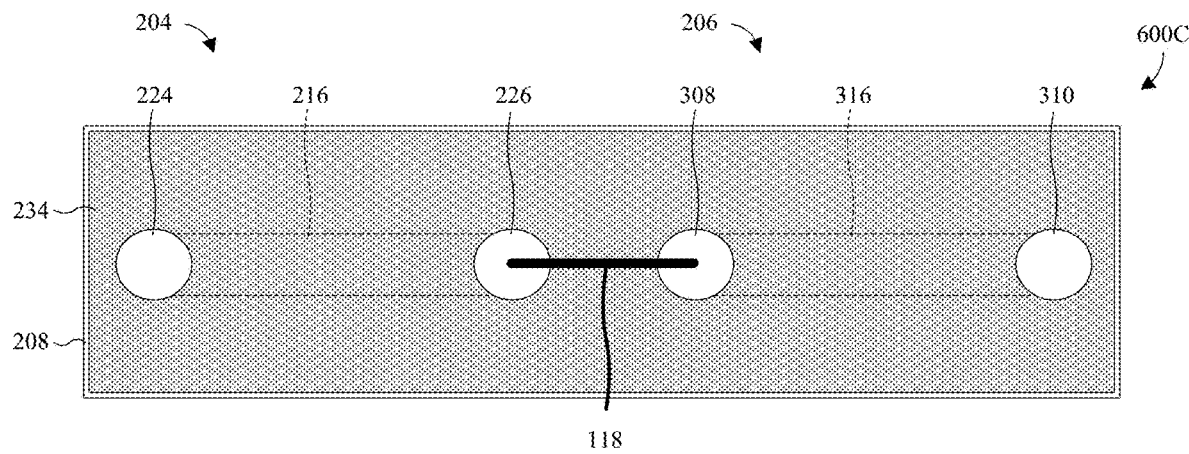

As illustrated in views 500A-500C of FIGS. 5A-5C, the first inductor unit 204 does not comprise a first magnetic layer 214 or a second magnetic layer 236. Instead, the first conductive wire 216 and the second conductive wire 218 are separated from the passivation layer 212 by only a barrier layer 222. Although the inductor unit 204 does not comprises a first magnetic layer 214 or a second magnetic layer 236, each inductor unit 204/206 has a measurable inductance when current flows through their respective conductive wires 216/218/316/320. Because each inductor unit 204/206 comprises a first conductive wire 216/316 and a second conductive wire 218/320, the first inductor unit 204 and second inductor unit 206 can be connected via conductive traces 118 of a PCB (not shown) in either dual-current configuration or single-current configuration. In other embodiments, as illustrated in views 600A-600C of FIGS. 6A-6C, the inductor unit 204/206 may comprise only a single conductive wire 216/316 continuously extending from a first I/O bond structure 224/308 to a second I/O bond structure 226/310.

Figure 7A:
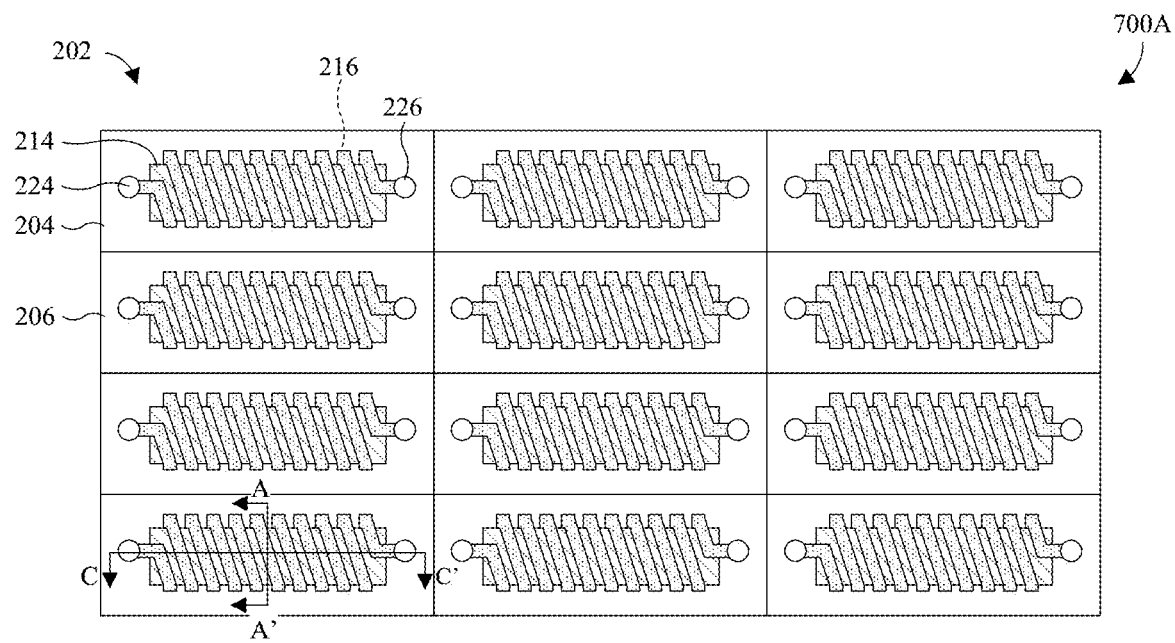
Figure 7B:
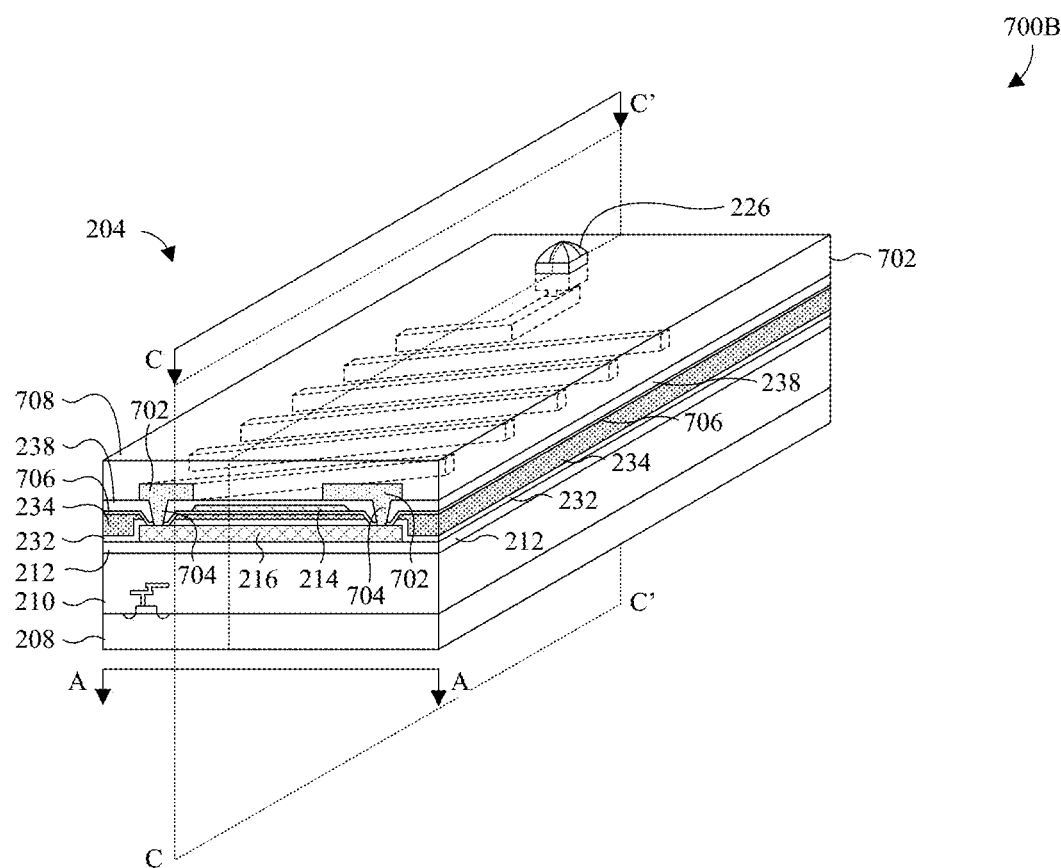

With reference to FIGS. 7A-7E, various views 700A-700E of some more embodiments of the multi-terminal inductor 202 of the present disclosure are provided. FIG. 7A illustrates a simplified top view 700A of some embodiments of the multi-terminal inductor 202 of the present disclosure. FIG. 7B illustrates a perspective view 700B of some embodiments of the first inductor unit 204 of the multi-terminal inductor 202 of FIG. 7A projecting from line A-A' of FIG. 7A to a side of the first inductor unit 204. FIG. 7C illustrates a more detailed cross-sectional view 700C of some embodiments of the first inductor unit 204 of the multi-terminal inductor 202 of FIG. 2A, taken along line C-C' of FIG. 7A. FIG. 7D illustrates a cross-sectional view 700D of some embodiments of the first inductor unit 204 of the multi-terminal inductor 202 of FIG. 7A, taken along line A-A' of FIG. 7B. FIG. 7E illustrates a simplified top view 700E of some embodiments of the first inductor unit 204 of the multi-terminal inductor 202 of FIGS. 7A-7D. FIGS. 7A and 7E are "simplified" because several layers and features depicted in FIGS. 7B-7D are not illustrated, for example, the second dielectric layer 238 is not depicted.

As illustrated by the views 700A-700E of FIGS. 7A-7E, the first inductor unit 204 comprises a second conductive wire 702 disposed over the first conductive wire 216. In some embodiments, vias 704 connect the second conductive wire 702 to the first conductive wire 216, such that the first conductive wire 216 and the second conductive wire 702 continuously extend from the first I/O bond structure 224 to the second I/O bond structure 226 in a helical pattern around the first magnetic layer 214. The second conductive wire 702 and the vias 704 may, for example, be deposited or grown by CVD, PVD, ALD, sputtering, electrochemical plating, electroless plating, or some other deposition or growth process. The vias 704 may, for example, be formed by a single damascene like process or a dual damascene process.

The second conductive wire 702 and the vias 704 comprise a conductive material, such as copper (Cu), aluminum (Al), gold (Au), silver (Ag), Al—Cu compounds, or any other suitable conductive material. In some embodiments, the second conductive wire 702 may be a post-passivation copper interconnect. In some embodiments, the second conductive wire 702 has a thickness in a range from about 0.5 µm to about 50 µm and/or a width in a range from about 0.5 µm to about 50 µm. More specifically, the second conductive wire 702 may have a thickness/width in a range from 0.5 µm to 5 µm, 5 µm to 10 µm, 10 µm to 15 µm, 15 µm to 20 µm, 20 µm to 25 µm, 25 µm to 30 µm, 30 µm to 40 µm, or 40 µm to 50 µm.

A third isolation layer 706 separates the first magnetic layer 214 from the first dielectric layer 234. In some embodiments, the vias 704 extend through the third isolation layer 706 to connect the second conductive wire 702 to the first conductive wire 216. The third isolation layer 706 comprises a dielectric material, such as $SiO_2$, $Si_3N_4$, a low-k dielectric, or some other suitable dielectric material. The third isolation layer 706 may, for example, be deposited or grown by CVD, PVD, ALD, sputtering, or some other deposition or growth process.

A third dielectric layer 708 is disposed over the second dielectric layer 238. In some embodiments, the third dielectric layer 708 extends between sidewalls of the second conductive wire 702 and contacts an upper surface of the second dielectric layer 238. Further, the third dielectric layer 708 may have a substantially planar upper surface. In some embodiments, the third dielectric layer 708 may, for example, be a polyimide compound, a polybenzoxazole compound, and/or any other suitable dielectric material. The third dielectric layer 708 may, for example, be deposited or grown by CVD, PVD, ALD, sputtering, a spin-on process, or some other deposition or growth process.

Figure 8:
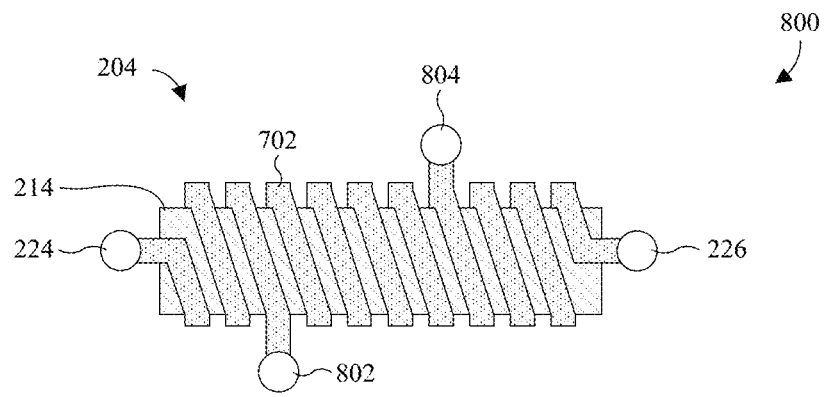
FIG. 8 illustrates a simplified top view of some more embodiments of the first inductor unit of the multi-terminal inductor of FIGS. 7A-7E.

With reference to FIG. 8, a simplified top view 800 of some embodiments of the first inductor unit 204 of the multi-terminal inductor 202 of FIGS. 7A-7E is provided. FIG. 8 is "simplified" because FIG. 8 illustrates only the second conductive wire 702 continuously extending in a helical pattern around the first magnetic layer 214.

As illustrated in view 800 of FIG. 8, in some embodiments, the first inductor unit 204 may comprise a third I/O bond structure 802 and a fourth I/O bond structure 804 disposed between the first I/O bond structure 224 and the second I/O bond structure 226. Thus, the I/O bond structures 224/226/802/804 can be connected in various combinations, such that the first inductor unit 204 can be configured to have various inductances. Accordingly, because the multi-terminal inductor 202 has a plurality of inductor units 204/206, the multi-terminal inductor unit 202 provides customers (or manufacturers) with more inductance options without requiring an application specific inductor design, which would result in increased manufacturing costs or inefficient operating conditions.

Figure 9:
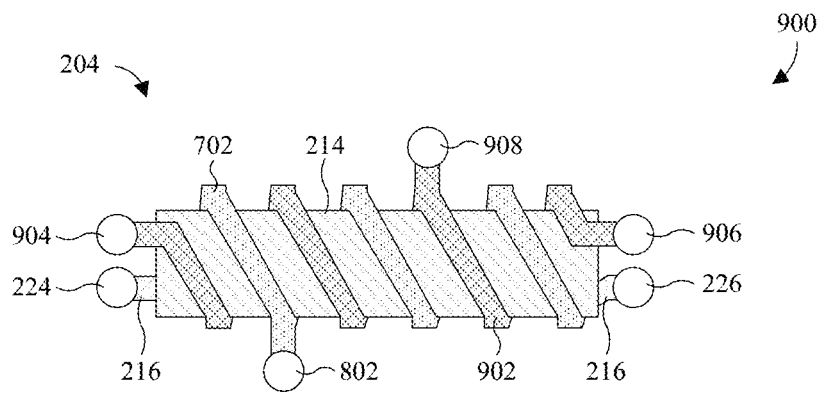
FIG. 9 illustrates a simplified top view of some more embodiments of the first inductor unit of the multi-terminal inductor of FIGS. 7A-7E.

With reference to FIG. 9, a simplified top view 900 of some embodiments of the first inductor unit 204 of the multi-terminal inductor 202 of FIGS. 7A-7E is provided. FIG. 9 is "simplified" because FIG. 9 illustrates only the first conductive wire 216 and the second conductive wire 702 continuously extending in a helical pattern around the first magnetic layer 214, and a third conductive wire 902 continuously extending around the first magnetic layer 214 in a helical pattern.

As illustrated in view 900 of FIG. 9, in some embodiments, the first inductor unit 204 may comprise a third conductive wire 902. The third conductive wire 902 extends from a first I/O bond structure 904 of the third conductive wire 902 to a second I/O bond structure 906 of the third conductive wire 902. In some embodiments, a third I/O bond structure 908 of the third conductive wire 902 is disposed between the first I/O bond structure 904 of the third conductive wire 902 and the second I/O bond structure 906 of the third conductive wire 902. In some embodiments, vias (not shown) connect the third conductive wire 902 to a fourth conductive wire (not shown), such that the third conductive wire 902 and fourth conductive wire (not shown) continuously extend from the first I/O bond structure 904 of the third conductive wire 902 to the second I/O bond structure 906 of the third conductive wire 902 in a helical pattern. The helical pattern of the first conductive wire 216 and second conductive wire 702 crosses the helical pattern of the third conductive wire 902 and the fourth conductive wire (not shown), but each helical pattern is configured to transmit a discrete signal along their respective conductive wires 216/702/902.

Figure 10A:
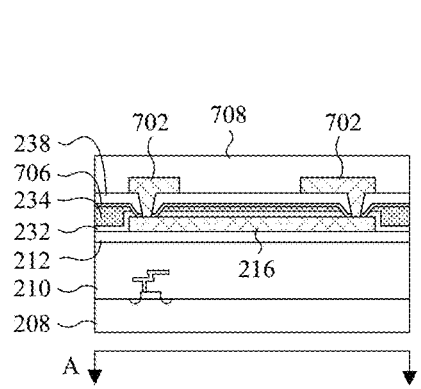
FIGS. 10A-10C illustrate various views of some more embodiments of the multi-terminal inductor of FIGS. 7A-7E without a first magnetic layer.
Figure 10B:
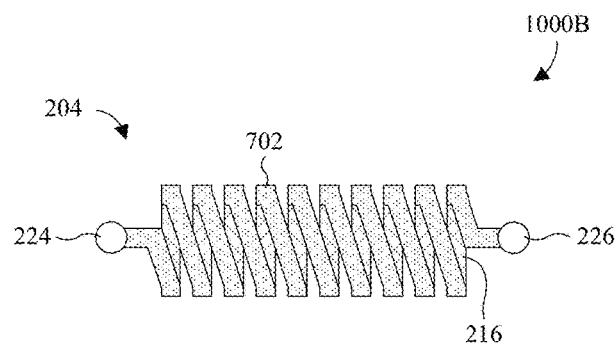
Figure 10C:
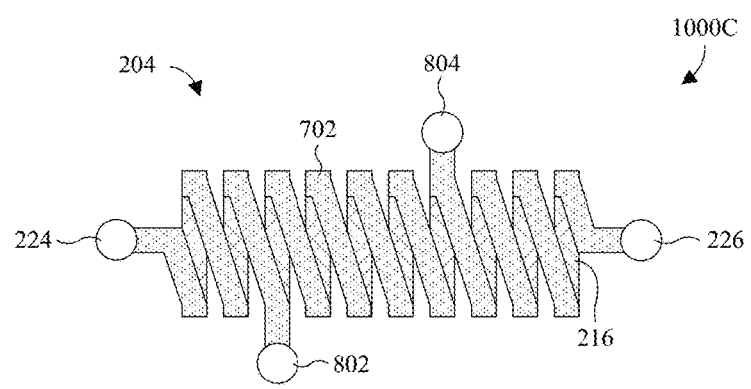

With reference to FIGS. 10A-10C, various views 1000A-1000C of more embodiments of the multi-terminal inductor 202 of FIGS. 7A-7E without a first magnetic layer 214 are provided. FIG. 10A is a cross-sectional view 1000A, taken along line A-A' of FIG. 7A, of some embodiments of the first inductor unit 204 without the first magnetic layer 214. FIG. 10B is a simplified top view 1000B of some embodiments of the first inductor unit 204 of the multi-terminal inductor 202 of FIGS. 7A-7E without a first magnetic layer 214. FIG. 10C is a simplified top view 1000C of some other embodiments of the first inductor unit 204 of the multi-terminal inductor 202 of FIGS. 7A-7E without a first magnetic layer 214. FIGS. 10B-10C are "simplified" because FIGS. 10B-10C illustrate only the first conductive wire 216 and the second conductive wire 702 continuously extending in a helical pattern.

As illustrated in views 1000A-1000C of FIGS. 10A-10C, the first inductor unit 204 does not comprise a first magnetic layer 214. Instead, the first conductive wire 216 and the second conductive wire 702 are connected by vias (not shown), such that the first conductive wire 216 and the second conductive wire 702 continuously extend in a helical pattern. In some embodiments, the first conductive wire 216 and the second conductive wire 702 continuously extend in a helical pattern around a dielectric material (not shown). In some embodiments, the dielectric layer may comprise multiple layers, or be a single bulk dielectric material, such as a polyimide compound, a polybenzoxazole compound, and/or any other suitable dielectric material.

With reference to FIGS. 11-17, a series of views 1100-1700 of some embodiments of a method for forming an inductor unit 204/206 of the multi-terminal inductor unit 202 of the present disclosure is provided.

Figure 11:
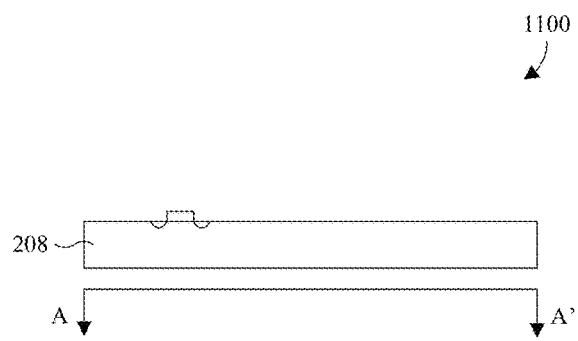
FIGS. 11-17 illustrate a series of views of some embodiments of a method for forming a multi-terminal inductor of the present disclosure.

As illustrated by the view 1100 of FIG. 11, a semiconductor substrate 208 is provided. The semiconductor substrate 208 may comprise any type of semiconductor body (e.g., monocrystalline silicon/CMOS bulk, SiGe, silicon on insulator (SOI), etc.). In some embodiments, semiconductor devices are formed within/over the semiconductor substrate 208. For example, the semiconductor device may be a transistor comprising a gate stack (e.g., a metal gate disposed over a high-k dielectric) disposed over the semiconductor substrate 208 and between a source and drain, while the source and drain are disposed within the semiconductor substrate 208.

In some embodiments, a process for forming the semiconductor devices comprises forming a patterned photoresist layer (not shown) on the semiconductor substrate 208. The patterned photoresist layer may, for example, be formed by a spin-on process. The patterned photoresist layer may, for example, be patterned with a layout having a plurality of sources/drains and may, for example, be patterned using photolithography. In some embodiments, the process for forming the source/drain of the semiconductor devices comprises performing ion implantation with the patterned photoresist in place, and subsequently stripping the patterned photoresist. Further, in some embodiments, the gate may be, for example, formed by CVD, PVD, ALD, sputtering, a spin-on process, or some other deposition or growth process with the patterned photoresist (not shown) in place, and subsequently stripping the patterned photoresist.

Figure 12:
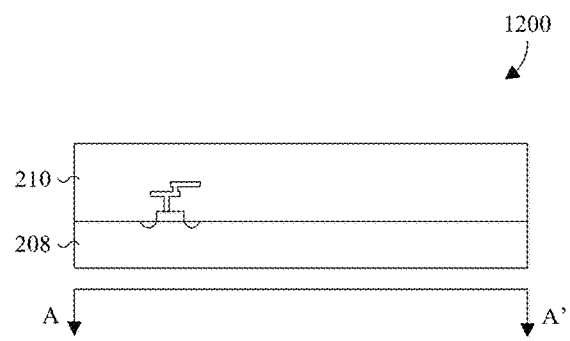

As illustrated by the view 1200 of FIG. 12, an interconnect structure 210 is formed over and in direct contact with the semiconductor substrate 208. The interconnect structure 210 comprises a plurality of conductive features, such as metal interconnect wires, vias, and/or contact pads interconnecting semiconductor devices. In some embodiments, the plurality of conductive features are formed in a plurality of metal layers formed over one another. In some embodiments, the conductive features may be formed by a combination of photolithography and applicable deposition or growth processes, such as electrochemical plating, electroless plating, chemical or physical vapor deposition, sputtering, or some other deposition or growth process. The process may, for example, be part of a single damascene like process or a dual damascene like process. In some embodiments, a chemical mechanical polishing (CMP) process may be performed after forming each metal layer to form substantially planar upper surfaces.

Figure 13:
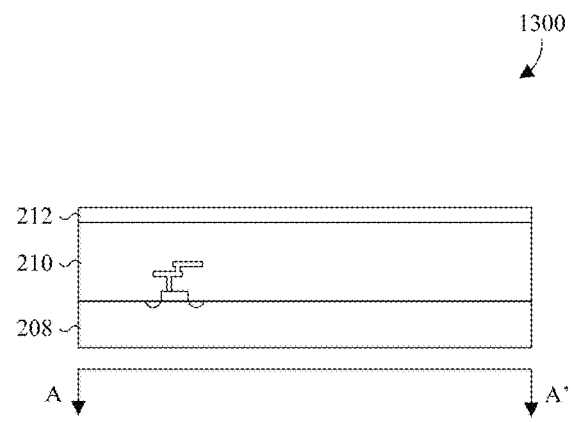

As illustrated by the view 1300 of FIG. 13, a passivation layer 212 is formed over and in direct contact with the interconnect structure 210. The passivation layer 212 may comprise a dielectric material, such as $SiO_2$, silicon nitride ($Si_3N_4$), polyimide compounds, or other suitable materials. The passivation layer 212 may, for example, be formed by a combination of photolithography and an applicable deposition or growth process, such as CVD, PVD, sputtering, a spin-on process, or some other deposition or growth process. In some embodiments, a CMP process may be performed after the passivation layer 212 is deposited to create a substantially planar upper surface.

Figure 14:
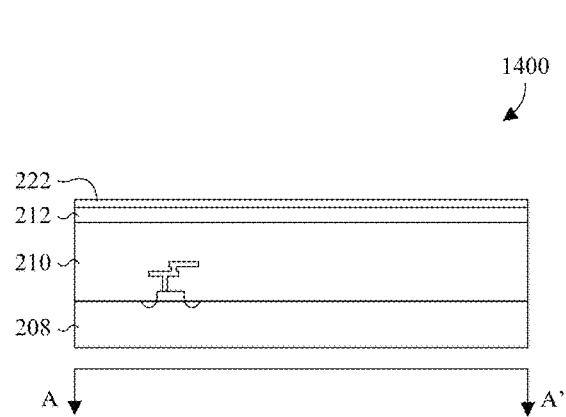

As illustrated by the view 1400 of FIG. 14, a barrier layer 222 is formed over and in direct contact with the passivation layer 212. In some embodiments, the barrier layer 222 comprises tantalum (Ta), tantalum nitride (TaN), titanium (Ti), titanium nitride (TiN), and/or tungsten (W) among others. The barrier layer 222 may, for example, be deposited or grown by CVD, PVD, ALD, sputtering, electrochemical plating, electroless plating, or some other deposition or growth process. In some embodiments, the barrier layer 222 conformally lines the passivation layer 212. Although not depicted in view 1600 of FIG. 14, it will be appreciated that a seed layer, from which the conductive wire 216/218 is grown, may be formed over the barrier layer 222. The seed layer comprises Cu, Cu alloys, Al, Al alloys, Au, Ag, Al—Cu compounds, or other suitable materials, and may coalesce into the conductive wire 216/218 when the conductive wire 216/218 is grown from the seed layer. The seed layer may, for example, be deposited or grown by CVD, PVD, ALD, sputtering, electrochemical plating, electroless plating, or some other deposition or growth process.

Figure 15:
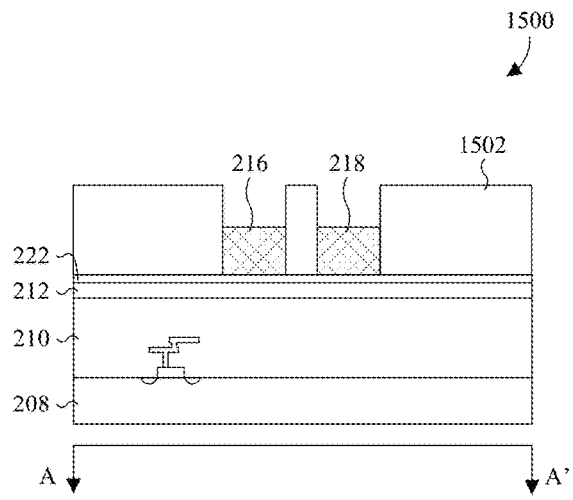

As illustrated by the view 1500 of FIG. 15, a first conductive wire 216 and a second conductive wire 218 are formed, with a patterned photoresist layer 1502 in place, over and in direct contact with the barrier layer 222. The patterned photoresist layer 1502 is formed over the barrier layer 222 by, for example, a spin-on process in combination with a subsequent photolithography process to define openings in the patterned photoresist layer 1502. The first conductive wire 216 and the second conductive wire 218 may, for example, be deposited or grown by CVD, PVD, ALD, sputtering, electrochemical plating, electroless plating, or some other deposition or growth process. In further embodiments, the first conductive wire 216 and the second conductive wire 218 may comprise, for example, Cu, Al, Au, Ag, Al—Cu compounds, or any other suitable conductive material.

The patterned photoresist layer 1502 is subsequently stripped from the barrier layer 222 by, for example, a wet etch or dry etch process. In some embodiments, the stripping of the patterned photoresist layer 1502 also removes portions of the barrier layer 222 that are not covered by the conductive wires 216/218. In other embodiments, a subsequent etching and photolithography process may be performed to remove portions of the barrier layer 222 that are not covered by the conductive wires 216/218.

Figure 16:
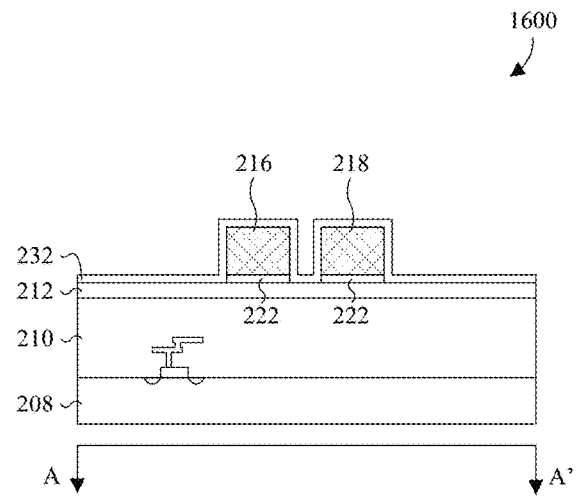

As illustrated by the view 1600 of FIG. 16, a second isolation layer 232 is formed over the first conductive wire 216 and the second conductive wire 218. In some embodiments, the second isolation layer conformally lines and is in direct contact with the passivation layer 212, the first conductive wire 216, and the second conductive wire 218. The second isolation layer 232 comprises a dielectric material, such as $SiO_2$, $Si_3N_4$, a low-k dielectric, or some other suitable dielectric material. The second isolation layer 232 may, for example, be deposited or grown by CVD, PVD, ALD, sputtering, or some other deposition or growth process.

Figure 17:
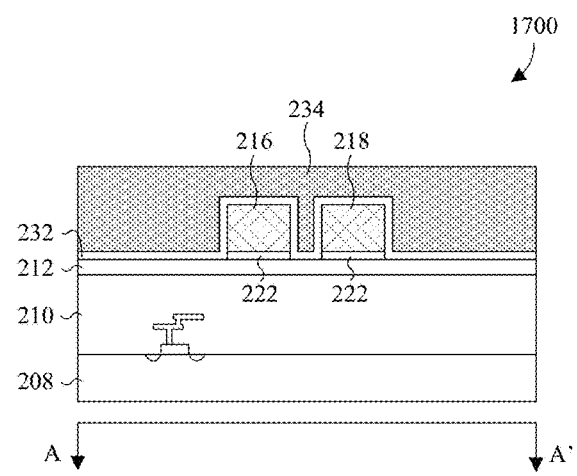

As illustrated by the view 1700 of FIG. 17, a first dielectric layer 234 is formed over and in direct contact with the second isolation layer 232. The first dielectric layer 234 may, for example, be a polyimide compound, a polybenzoxazole compound, or any other suitable dielectric material. The first dielectric layer 234 may, for example, be deposited or grown by CVD, PVD, ALD, sputtering, a spin-on process, or some other deposition or growth process. In some embodiments, a CMP process may be performed after the first dielectric layer 234 is deposited to create a substantially planar upper surface.

Although not shown in the cross-sectional views 1100-1700 taken along A-A', it will be appreciated that I/O bond structures 224/226/228/230 extending through the first dielectric layer 234 and the second dielectric layer 238 are formed to provide connections to the conductive wires 216/218. For example, the I/O bond structures 224/226/228/230 may comprise a bond pad disposed over the second dielectric layer 238. The I/O bond structures extend from the bond pad through the second dielectric layer 238 and the first dielectric layer 234 to their respective conductive wires 216/218. In some embodiments, the I/O bond structures 224/226/228/230 comprise Cu, Cu alloys, Al, Al alloys, Au, Ag, Al—Cu compounds, or other suitable materials. The I/O bond structures 224/226/228/230 may, for example, be formed by CVD, PVD, ALD, sputtering, electrochemical plating, electroless plating, or some other deposition or growth process.

Further, although FIGS. 11-17 illustrate a process for forming the embodiment depicted in FIG. 5A-5C, it will be appreciated that a person of ordinary skill could implement the steps above (or substantially similar steps) to form the embodiments depicted in FIGS. 2A-2C, 3A-3C, FIGS. 4A-4C, FIGS. 6A-6C, FIGS. 7A-7E, FIG. 8, FIG. 9, and FIGS. 10A-10C.

Figure 18:
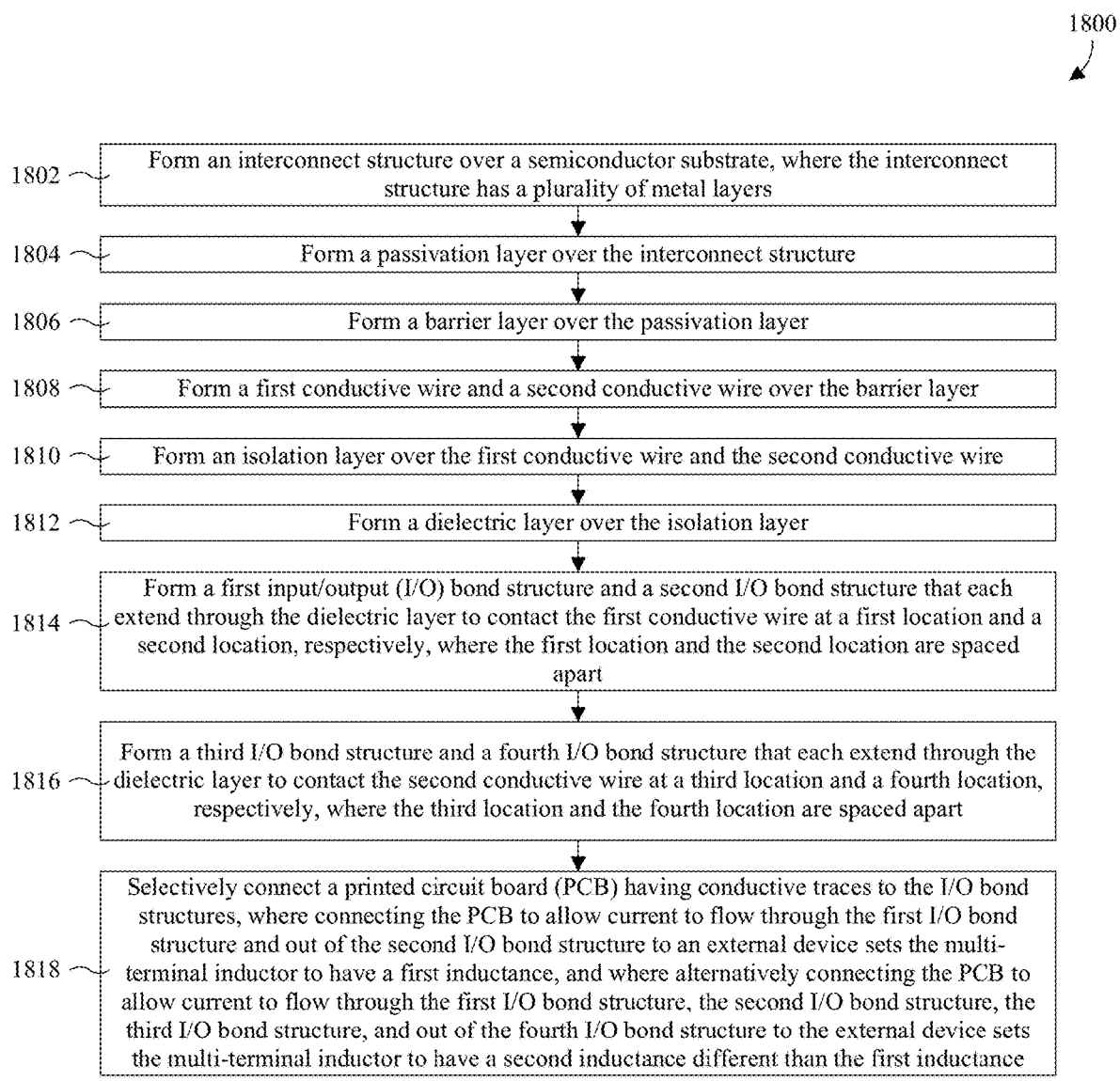
FIG. 18 illustrates a flowchart of some embodiments of a method for forming the multi-terminal inductor of the present disclosure and selectively setting the inductance of the multi-terminal inductor of the present disclosure.

With reference to FIG. 18, a flowchart 1800 of some embodiments of the method for forming the multi-terminal inductor of the present disclosure and selectively setting the inductance of the multi-terminal inductor is provided. While the disclosed method and other methods illustrated and/or described herein may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1802, an interconnect structure is formed over a semiconductor substrate, where the interconnect structure has a plurality of metal layers. An example of act 1802 can be seen with regards to previously illustrated FIG. 12.

At 1804, a passivation layer is formed over the interconnect structure. An example of act 1804 can be seen with regards to previously illustrated FIG. 13.

At 1806, a barrier layer is formed over the passivation layer. An example of act 1806 can be seen with regards to previously illustrated FIG. 14.

At 1808, a first conductive wire and a second conductive wire are formed over the barrier layer. An example of act 1808 can be seen with regards to previously illustrated FIG. 15.

At 1810, an isolation layer is formed over the first conductive wire and the second conductive wire. An example of act 1810 can be seen with regards to previously illustrated FIG. 16.

At 1812, a dielectric layer is formed over the isolation layer. An example of act 1812 can be seen with regards to previously illustrated FIG. 17.

At 1814, a first input/output (I/O) bond structure and a second I/O bond structure are formed at a first location and a second location, respectively. The first location and the second location are spaced apart. The first I/O bond structure extends through the dielectric layer to contact the first conductive wire at the first location. The second I/O bond structure extends through the dielectric layer to contact the first conductive wire at the second location. In some embodiments, the first I/O bond structure and the second I/O bond structure comprise Cu, Cu alloys, Al, Al alloys, Au, Ag, Al—Cu compounds, or other suitable materials. The first I/O bond structure and the second I/O bond structure may, for example, be formed by CVD, PVD, ALD, sputtering, electrochemical plating, electroless plating, or some other deposition or growth process. An example of a first I/O bond structure and a second I/O bond structure contacting a first conductive wire can be seen with regards to previously illustrated FIGS. 4A-4C.

At 1816, a third I/O bond structure and a fourth I/O bond structure are formed at a third location and a fourth location, respectively. The third location and the fourth location are spaced apart. The third I/O bond structure extends through the dielectric layer to contact the second conductive wire at the third location. The fourth I/O bond structure extends through the dielectric layer to contact the second conductive wire at the fourth location. In some embodiments, the third I/O bond structure and the fourth I/O bond structure comprise Cu, Cu alloys, Al, Al alloys, Au, Ag, Al—Cu compounds, or other suitable materials. The third I/O bond structure and the fourth I/O bond structure may, for example, be formed by CVD, PVD, ALD, sputtering, electrochemical plating, electroless plating, or some other deposition or growth process. An example of a third I/O bond structure and a fourth I/O bond structure contacting a second conductive wire can be seen with regards to previously illustrated FIGS. 4A-4C.

At 1818, a printed circuit board (PCB) having conductive traces is selectively connected to the I/O bond structures. Connecting the PCB to allow current to flow through the first I/O bond structure and out of the second I/O bond structure to an external device, sets the multi-terminal inductor to have a first inductance. Alternatively, connecting the PCB to allow current to flow through the first I/O bond structure, the second I/O bond structure, the third I/O bond structure, and out of the fourth I/O bond structure to the external device, sets the multi-terminal inductor to have a second inductance different than the first inductance. In some embodiments, the second inductance is greater than the first inductance. An example of alternative connections between I/O bond structures can be seen with regards to previously illustrated FIGS. 1A-1B.

Thus, as can be appreciated from above, the present disclosure relates to a multi-terminal inductor that provides customers (or manufactures) with increased inductance options without requiring an application specific inductor design. Accordingly, the multi-terminal inductor may improve the functionality of ICs and cost of manufacturing ICs.

Accordingly, in some embodiments, the present application provides a multi-terminal inductor. The multi-terminal inductor includes a semiconductor substrate. An interconnect structure having a plurality of metal layers is arranged over the semiconductor substrate. A first magnetic layer is arranged over an uppermost surface of the interconnect structure. A conductive wire is arranged over the first magnetic layer. A first input/output (I/O) bond structure branches off of the conductive wire at a first location. A second I/O bond structure branches off of the conductive wire at a second location. The second location is spaced apart from the first location. A third I/O bond structure branches off of the conductive wire at a third location between the first location and the second location, where a connection between the third I/O bond structure and the first I/O bond structure has a first inductance and an alternative connection between the first I/O bond structure and the second I/O bond structure has a second inductance that is greater than the first inductance.

In other embodiments, the present application provides a multi-terminal inductor having a semiconductor substrate. An interconnect structure having a plurality of metal layers is arranged over the semiconductor substrate. A passivation layer is arranged over an uppermost surface of the interconnect structure. A magnetic layer is arranged over the passivation layer. A plurality of inductor units including a plurality of conductive wires, respectively, are spaced apart from one another and arranged over the magnetic layer, where a first inductor unit includes a dielectric layer extending over a first conductive wire of the first inductor unit and includes a first terminal and a second terminal that extend through the dielectric layer to provide electrical connections to the first conductive wire of the first inductor unit. A connection structure is arranged over the dielectric layer and has conductive traces electrically coupled to the first and second terminals, where the connection structure electrically couples some, but not all, of the plurality of inductor units in series with one another.

In yet other embodiments, the present application provides a method. The method includes forming an interconnect structure having a plurality of metal layers over a semiconductor substrate. A passivation layer is formed over an uppermost surface of the interconnect structure. A first magnetic layer is formed over the passivation layer. A plurality of conductive wires that are spaced apart from one another are formed over the first magnetic layer. A dielectric layer is formed over the plurality of conductive wires. A plurality of solder bumps are formed over the dielectric layer, where different solder bumps of the plurality of solder bumps are electrically coupled to different conductive wires. A printed circuit board (PCB) having conductive traces is selectively connected to some, but not all, of the plurality of solder bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multi-terminal inductor, comprising:
an interconnect structure disposed over a semiconductor substrate;
a first conductive wire disposed over the interconnect structure;
a first input/output (I/O) bond structure that branches off of the first conductive wire at a first location;
a second I/O bond structure that branches off of the first conductive wire at a second location, wherein the second location is spaced from the first location; and
a third I/O bond structure that branches off of the first conductive wire at a third location between the first location and the second location, wherein a connection between the third I/O bond structure and the first I/O bond structure has a first inductance and an alternative connection between the first I/O bond structure and the second I/O bond structure has a second inductance that is greater than the first inductance.

2. The multi-terminal inductor of claim 1, further comprising:
a passivation layer disposed over an uppermost surface of the interconnect structure, wherein the first conductive wire is disposed over the passivation layer.

3. The multi-terminal inductor of claim 2, further comprising:
a barrier layer disposed between the passivation layer and the first conductive wire.

4. The multi-terminal inductor of claim 3, wherein the barrier layer contacts both the passivation layer and the first conductive wire.

5. The multi-terminal inductor of claim 4, further comprising:
an isolation layer disposed over the passivation layer, the barrier layer, and the first conductive wire, wherein the isolation layer lines an upper surface of the passivation layer, sidewalls of the barrier layer, sidewalls of the first conductive wire, and an upper surface of the first conductive wire.

6. The multi-terminal inductor of claim 5, further comprising:
a dielectric layer disposed over the isolation layer, the passivation layer, the barrier layer, and the first conductive wire, wherein the first I/O bond structure, the second I/O bond structure, and the third I/O bond structure each extend from the first conductive wire through an uppermost surface of the dielectric layer.

7. The multi-terminal inductor of claim 1, wherein the first I/O bond structure, the second I/O bond structure, and the third I/O bond structure each extend from an upper surface of the first conductive wire vertically away from the semiconductor substrate.

8. The multi-terminal inductor of claim 7, further comprising:
a dielectric layer disposed over the first conductive wire and over the interconnect structure, wherein the first I/O bond structure, the second I/O bond structure, and the third I/O bond structure each extend through an uppermost surface of the dielectric layer.

9. The multi-terminal inductor of claim 1, further comprising:
a second conductive wire disposed over the interconnect structure and the first conductive wire; and
a plurality of conductive vias disposed between the first conductive wire and the second conductive wire, wherein the plurality of conductive vias connect the first conductive wire to the second conductive wire, such that the first conductive wire, the second conductive wire, and the plurality of conductive vias make up a conductive helical pattern that continuously extends from the first I/O bond structure to the second I/O bond structure.

10. The multi-terminal inductor of claim 9, further comprising:
a dielectric layer disposed over the interconnect structure and the first conductive wire, wherein:
the second conductive wire is disposed over the dielectric layer;
the plurality of conductive vias extend through the dielectric layer to connect the first conductive wire to the second conductive wire; and
the conductive helical pattern continuously extends around a portion of the dielectric layer.

11. The multi-terminal inductor of claim 9, further comprising:
a magnetic layer disposed over the interconnect structure and the first conductive wire, wherein:
the second conductive wire is disposed over the magnetic layer;
the first conductive wire is disposed below the magnetic layer; and
the conductive helical pattern continuously extends around at least a portion of the magnetic layer.

12. The multi-terminal inductor of claim 11, further comprising:
a dielectric layer disposed over the interconnect structure, the first conductive wire, and the magnetic layer, wherein:
the magnetic layer is disposed between an upper surface of the dielectric layer and an upper surface of the first conductive wire;
the plurality of conductive vias extend through the dielectric layer to connect the first conductive wire to the second conductive wire; and
the plurality of conductive vias extend through the dielectric layer at locations disposed outside a perimeter of the magnetic layer.

13. A multi-terminal inductor, comprising:
an interconnect structure disposed over a semiconductor substrate;
a passivation layer disposed over an uppermost surface of the interconnect structure;
a plurality of inductor units disposed over the passivation layer and comprising a plurality of conductive wires, respectively, wherein a first inductor unit of the plurality of inductor units comprises a first conductive wire of the plurality of conductive wires;
a dielectric layer disposed over the plurality of conductive wires;
a first terminal extending through the dielectric layer and electrically coupled to the first conductive wire at a first location;
a second terminal extending through the dielectric layer and electrically coupled to the first conductive wire at a second location different than the first location; and
a connection structure disposed over the dielectric layer and comprising conductive traces electrically coupled to the first and second terminals, wherein the connection structure electrically couples some, but not all, of the plurality of inductor units in series with one another.

14. The multi-terminal inductor of claim 13, wherein the connection structure is a printed circuit board (PCB) comprising the conductive traces.

15. The multi-terminal inductor of claim 14, wherein the first terminal includes a first solder bump and the second terminal includes a second solder bump.

16. The multi-terminal inductor of claim 13, further comprising:
a third terminal extending through the dielectric layer and electrically coupled to the first conductive wire at a third location disposed between the first location and the second location, wherein a first inductance measured between the first terminal and the second terminal is greater than a second inductance measured between the first terminal and the third terminal.

17. The multi-terminal inductor of claim 13, wherein the first conductive wire continuously extends laterally from the first terminal to the second terminal in a substantially straight line.

18. The multi-terminal inductor of claim 17, further comprising:
a third terminal extending through the dielectric layer and electrically coupled to a second conductive wire of the plurality of conductive wires at a third location different than the first and second locations, wherein the first inductor unit comprises the second conductive wire, and wherein the second conductive wire extends laterally in parallel with the first conductive wire; and
a fourth terminal extending through the dielectric layer and electrically coupled to the second conductive wire at a fourth location different than the first, second, and third locations.

19. A method, comprising:
forming an interconnect structure having a plurality of metal layers over a semiconductor substrate;
forming a passivation layer over an uppermost surface of the interconnect structure;
forming a plurality of conductive wires spaced apart from one another over the passivation layer;
forming a dielectric layer over the plurality of conductive wires; and
forming a plurality of pairs of conductive input/output (I/O) structures extending through an uppermost surface of the dielectric layer to the plurality of conductive wires, respectively, wherein a first pair of the conductive I/O structures comprises a first conductive I/O structure extending through the uppermost surface of the dielectric layer to a first conductive wire of the plurality of conductive wires and comprises a second conductive I/O structure spaced from the first conductive I/O structure and extending through the uppermost surface of the dielectric layer to the first conductive wire.

20. The method of claim 19, further comprising:
selectively connecting a connection structure comprising conductive traces to some, but not all, of the conductive I/O structures of the pairs of conductive I/O structures.

* * * * *